(12) United States Patent
Wu et al.

(10) Patent No.: US 12,349,384 B2
(45) Date of Patent: Jul. 1, 2025

(54) ISOLATION STRUCTURES IN MULTI-GATE SEMICONDUCTOR DEVICES AND METHODS OF FABRICATING THE SAME

(71) Applicant: Taiwan Semiconductor Manufacturing Co., Ltd., Hsinchu (TW)

(72) Inventors: Xusheng Wu, Hsinchu (TW); Chang-Miao Liu, Hsinchu (TW); Huiling Shang, Hsinchu County (TW)

(73) Assignee: TAIWAN SEMICONDUCTOR MANUFACTUIRNG CO., LTD., Hsinchu (TW)

(*) Notice: Subject to any disclaimer, the term of this patent is extended or adjusted under 35 U.S.C. 154(b) by 0 days.

(21) Appl. No.: 18/623,390

(22) Filed: Apr. 1, 2024

(65) Prior Publication Data

US 2024/0250152 A1    Jul. 25, 2024

Related U.S. Application Data

(63) Continuation of application No. 17/815,913, filed on Jul. 28, 2022, now Pat. No. 11,948,998, which is a
(Continued)

(51) Int. Cl.
*H01L 29/66*    (2006.01)
*H01L 21/02*    (2006.01)
(Continued)

(52) U.S. Cl.
CPC ....... *H10D 30/031* (2025.01); *H01L 21/7624* (2013.01); *H10D 30/026* (2025.01); *H10D 30/6735* (2025.01); *H10D 30/6757* (2025.01); *H10D 30/6758* (2025.01); *H10D 62/151* (2025.01); *H10D 64/015* (2025.01); *H10D 64/017* (2025.01); *H10D 64/018* (2025.01); *H01L 21/02236* (2013.01); *H01L 21/02238* (2013.01); *H01L 21/02255* (2013.01);
(Continued)

(58) Field of Classification Search
CPC .......... H01L 29/66742; H01L 21/7624; H01L 29/0847; H01L 29/42392; H01L 29/6653; H01L 29/66545; H01L 29/66553; H01L 29/66787; H01L 29/78603; H01L 29/78696; H01L 21/02236; H01L 21/02238; H01L 21/02255; H01L 21/2253; H01L 21/26533; H01L 29/0673; H01L 21/02164; H01L 29/66439; H01L 29/165; H01L 29/7848; H01L 29/775; H01L 21/823431; H01L 21/823481; H01L 27/0886; B82Y 10/00
USPC .......................................................... 257/349
See application file for complete search history.

(56) References Cited

U.S. PATENT DOCUMENTS 9,406,748 B1    8/2016  Balakrishnan et al.
11,444,179 B2   9/2022  Wu et al.
(Continued)

*Primary Examiner* — Tong-Ho Kim
(74) *Attorney, Agent, or Firm* — HAYNES AND BOONE, LLP

(57) ABSTRACT

A semiconductor structure includes a substrate, an oxide layer disposed over the substrate, a stack of semiconductor layers disposed over the oxide layer, and an epitaxial source/drain (S/D) feature disposed adjacent to the stack of semiconductor layers. A portion of the epitaxial S/D feature is horizontally surrounded by the oxide layer.

20 Claims, 19 Drawing Sheets

Related U.S. Application Data continuation of application No. 16/953,598, filed on Nov. 20, 2020, now Pat. No. 11,444,179.

(60) Provisional application No. 62/982,430, filed on Feb. 27, 2020.

(51) Int. Cl.

| | |
|---|---|
| *H01L 21/225* | (2006.01) |
| *H01L 21/265* | (2006.01) |
| *H01L 21/762* | (2006.01) |
| *H01L 29/06* | (2006.01) |
| *H01L 29/08* | (2006.01) |
| *H01L 29/423* | (2006.01) |
| *H01L 29/786* | (2006.01) |
| *H10D 30/01* | (2025.01) |
| *H10D 30/67* | (2025.01) |
| *H10D 62/13* | (2025.01) |
| *H10D 64/01* | (2025.01) |
| *H10D 62/10* | (2025.01) |

(52) U.S. Cl.
CPC .... *H01L 21/2253* (2013.01); *H01L 21/26533* (2013.01); *H10D 62/121* (2025.01)

(56) References Cited

U.S. PATENT DOCUMENTS

| | | | |
|---|---|---|---|
| 11,948,998 B2 * | 4/2024 | Wu | H01L 29/6653 |
| 2018/0254220 A1 | 9/2018 | Leobandung | |
| 2018/0254329 A1 * | 9/2018 | Guillorn | H01L 29/6653 |
| 2019/0341448 A1 * | 11/2019 | Bourjot | H01L 29/775 |
| 2020/0343372 A1 | 10/2020 | Yu et al. | |

\* cited by examiner

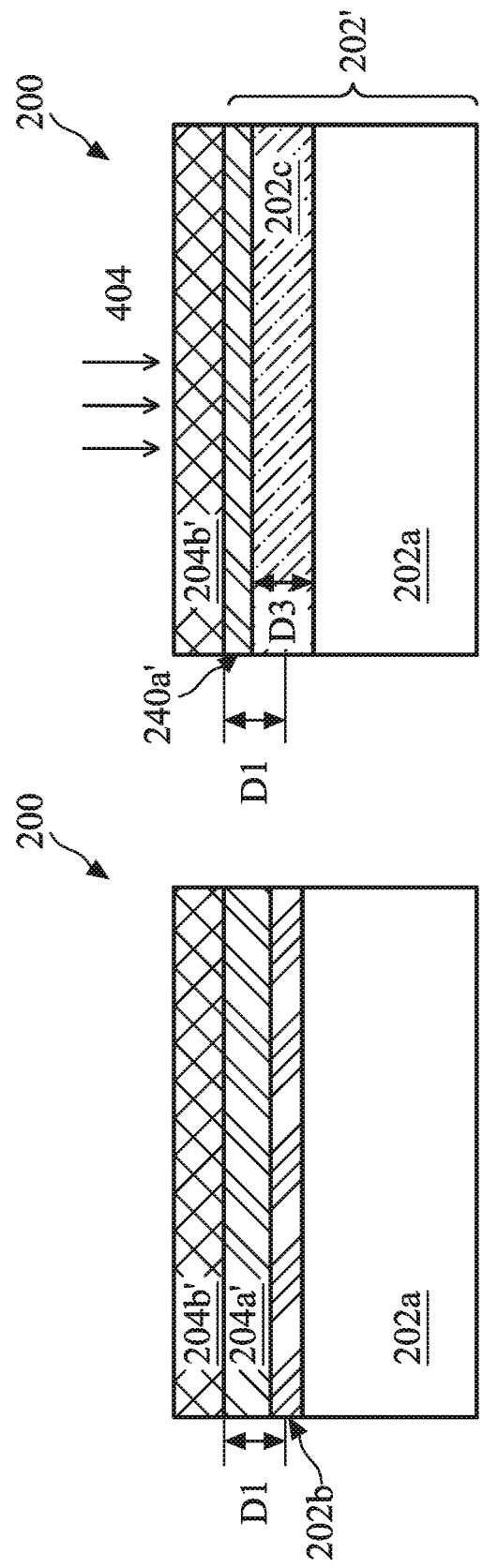

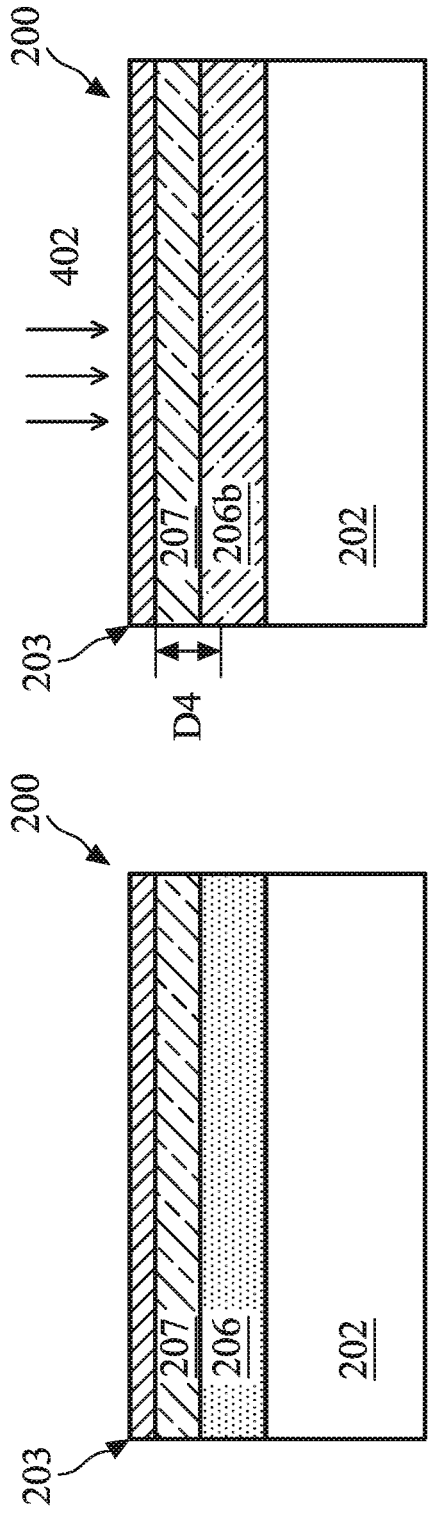
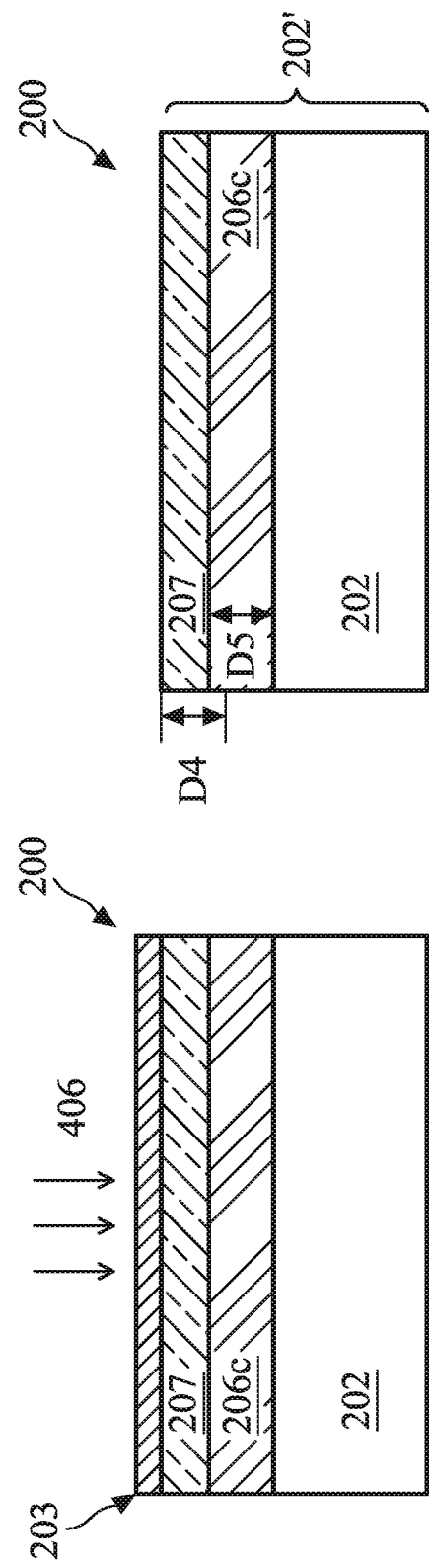
FIG. 7A
FIG. 7B
FIG. 7C
FIG. 7D

ISOLATION STRUCTURES IN MULTI-GATE SEMICONDUCTOR DEVICES AND METHODS OF FABRICATING THE SAME

CROSS-REFERENCE TO RELATED APPLICATIONS

This is a continuation application of U.S. patent application Ser. No. 17/815,913, filed on Jul. 28, 2022, which is a continuation application of U.S. patent application Ser. No. 16/953,598, filed on Nov. 20, 2020, now issued U.S. Pat. No. 11,444,179, which is a non-provisional application of and claims priority to U.S. Provisional Patent Application Ser. No. 62/982,430, filed Feb. 27, 2020, each of which is herein incorporated by reference in its entirety.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) field-effect transistors (FETs), have been incorporated into various memory and core devices to reduce IC chip footprint while maintaining reasonable processing margins. While methods of forming GAA FETs have generally been adequate, they have not been entirely satisfactory in all aspects. In one example, a GAA FET may suffer current leakage between heavily doped epitaxial source/drain (S/D) features and/or between the epitaxial S/D features and a doped substrate. In another example, a process of forming an S/D recess may introduce variation in the depths of the resulting epitaxial S/D features, inadvertently causing current leakage. Thus, for at least these reasons, improvements in methods of forming isolation structures in GAA FETs to reduce or eliminate current leakage associated with epitaxial S/D features are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4A, 5A, 5B, 6A, 6B, 7A, 7B, 7C, 7D, 8, 9A, 9B, 9C, 10, 11, 12, 13, 14A, 14B, and 14C are cross-sectional views of the semiconductor device taken along line AA' as shown in FIGS. 2A and/or 2B during intermediate stages of the method shown in FIGS. 1A and/or 1B according to various embodiments of the present disclosure.

DETAILED DESCRIPTION

Figure 1A:
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

GAA FETs have demonstrated attractive qualities over single-gate devices, such as fin-like FETs (FinFETs), in terms of control over short-channel effects (SCEs) and driving ability. A GAA FET may generally include a stack of channel layer in a multi-layer structure (ML) disposed over a semiconductor substrate, epitaxial S/D features formed over or in an active region (e.g., a fin), and a metal gate structure interleaved with a stack of channel layers and interposed between the S/D features. In some examples, due to presence of dopants in the epitaxial S/D features, the GAA FET may suffer high leakage current between the epitaxial S/D features and/or between the epitaxial S/D features and the semiconductor substrate, which may also be doped to form wells therein. Additionally, the process of forming an S/D recess may introduce variations in sizes (e.g., depths) of the resulting epitaxial S/D features. Furthermore, a bottommost GAA FET device in the ML may produce high leakage current due to poor gate control and potentially degrade performance of the GAA FETs. The present disclosure provides a dielectric layer (e.g., an oxide layer) embedded or buried in the semiconductor substrate and configured to isolate the epitaxial S/D features in order to minimize or eliminate adverse issues related to current leakage in GAA FETs.

Figure 1B:
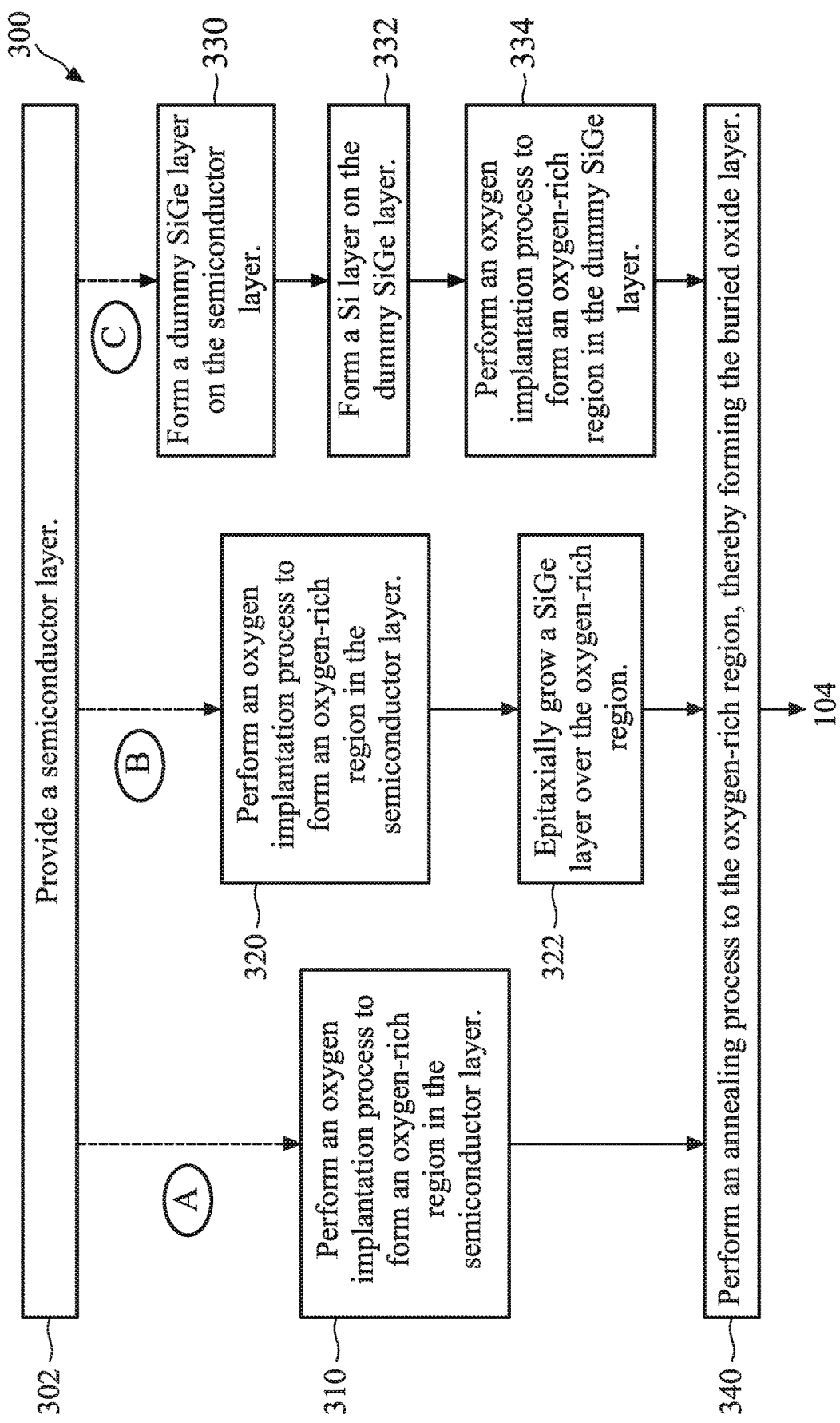

Referring now to FIGS. 1A and 1B, flowcharts of a method 100 and a method 300 of forming a semiconductor device 200 (hereafter simply referred to as the device 200) are illustrated according to various aspects of the present disclosure. Methods 100 and 300 are merely examples and are not intended to limit the present disclosure beyond what is explicitly recited in the claims. Additional operations can be provided before, during, and after methods 100 and 300, and some operations described can be replaced, eliminated, or moved around for additional embodiments of the method. Methods 100 and 300 are described below in conjunction with FIGS. 3-14C, which are cross-sectional views of the device 200 taken along the dashed line AA' shown in FIGS. 2A and 2B at intermediate steps of method 100. The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

At operation 102, method 100 forms a semiconductor substrate (hereafter referred to as the "substrate") 202' that includes an oxide layer embedded therein. Method 100 may form the substrate 202' in various embodiments as discussed in reference to method 300 and FIGS. 1B and 3-7D.

Figures 3, 4A:
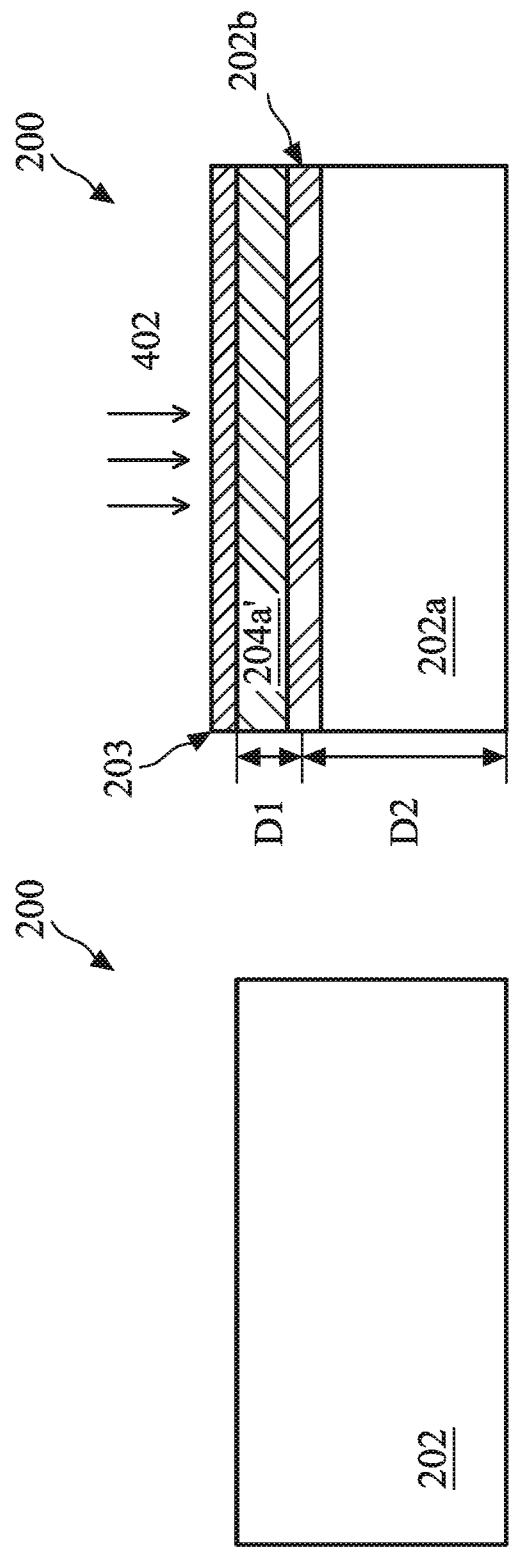

Referring to FIGS. 1B and 3, method 300 at operation 302 provides (or is provided with) a semiconductor layer 202. The semiconductor layer 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The semiconductor layer 202 may be a single-layer material having a uniform composition. Alternatively, the semiconductor layer 202 may include multiple material layers having similar or different compositions suitable for IC device manufacturing. In the present embodiments, the semiconductor layer 202 includes elemental Si and has a uniform composition throughout its thickness (i.e., along the Z axis as depicted herein).

In some examples where the semiconductor layer 202 includes FETs, various doped regions may be disposed in or on the semiconductor layer 202. The doped regions may be doped with n-type dopants, such as phosphorus or arsenic, and/or p-type dopants, such as boron or $BF_2$, depending on design requirements. The doped regions may be formed directly on the semiconductor layer 202, in a p-well structure, in an n-well structure, in a dual-well structure, or in a raised structure. Doped regions may be formed by implantation of dopant atoms, in-situ doped epitaxial growth, and/or other suitable techniques. Of course, these examples are for illustrative purposes only and are not intended to be limiting. Subsequently, method 300 may proceed from operation 302 in one of three pathways, Pathway A, Pathway B, or Pathway C, each being an equal alternative to the other two pathways in the present embodiments.

Referring to FIGS. 1B and 4A, method 300 proceeds from operation 302 to operation 310 along Pathway A and performs an oxygen implantation process 402 to form an oxygen-doped region 202b in the semiconductor layer 202. In the present embodiments, forming the oxygen-doped region 202b separates the semiconductor layer 202 into a bottom region 202a and a top region 204a' having the same composition. As will be discussed in detail below, the top region 204a' serves as one of the channel layers (e.g., the bottommost channel layer) of a multi-layer structure (ML) subsequently formed over the substrate 202'. In some embodiments, the oxygen-doped region 202b is formed at a distance D1 measured from a top surface of the semiconductor layer 202. The present embodiments do not limit the distance D1 to any particular value so long as the distance D1 is less than distance D2, which is a difference between the overall thickness of the semiconductor layer 202 and the distance D1. In other words, the oxygen-doped region 202b is closer to the top surface of the semiconductor layer 202 than to a bottom surface of the semiconductor layer 202. In some examples, the distance D1 is about 2 nm to about 10 nm.

In some embodiments, in order to protect the top region 204a' from subsequent processing steps, method 300 optionally forms a protective layer 203 over the semiconductor layer 202 (i.e., the top region 204a') before performing the oxygen implantation process 402. The protective layer 203 may be an oxide-containing layer formed by a suitable deposition process (e.g., chemical vapor deposition, or CVD, atomic layer deposition, ALD, other suitable processes, or combinations thereof). Alternatively, the protective layer 203 may be formed by oxidizing a portion of the top region 204a'. Accordingly, for embodiments in which the semiconductor layer 202 includes elemental Si, the protective layer 203 includes silicon oxide (i.e., $SiO_x$, where $1 \leq x \leq 2$). In the present embodiments, the protective layer 203 is a sacrificial layer configured to be removed after performing subsequent processing steps.

Figure 4B:
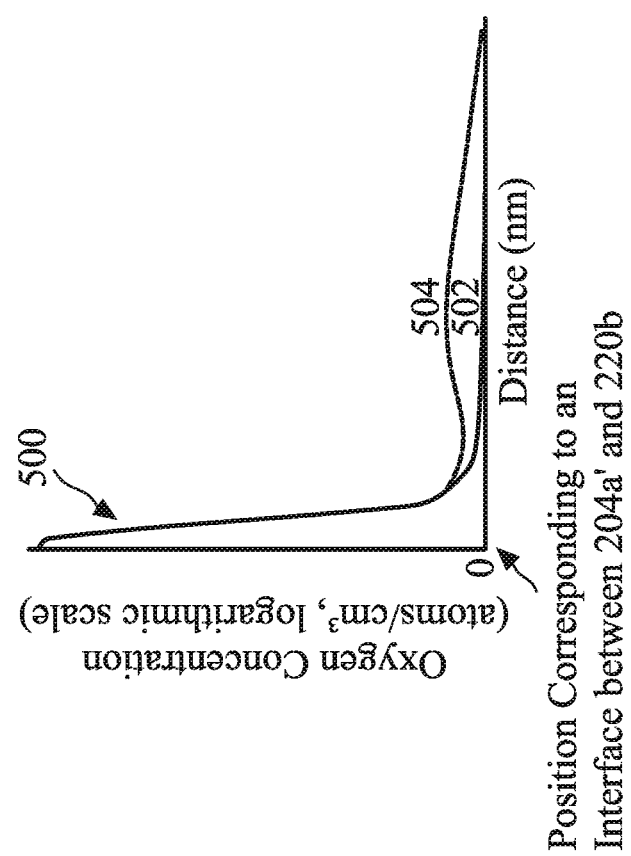
FIG. 4B is a schematic oxygen concentration profile within the semiconductor device according to various embodiments of the present disclosure.

The oxygen implantation process 402 may be implemented by any suitable method, such as ion implantation. Parameters such as energy of implantation, dosage of the dopant species (i.e., oxygen), angle of implantation, and/or other suitable parameters may be adjusted to achieve the desired implantation results for the oxygen implantation process 402. In some embodiments, various implantation parameters are adjusted to ensure that the oxygen-doped region 202b is formed at the distance D1 from the top surface of the semiconductor layer 202. In some examples, the energy of implantation may be about 0.5 keV to about 50 keV, and a range of dosage may be about 1E13 ions/$cm^2$ to about 1E16 ions/$cm^2$. Of course, these ranges are for illustrative purposes only and may be adjusted according to any desired distance D1. It is understood that increasing the distance D1 generally increases the energy of implantation. FIG. 4B is an example schematic of an oxygen dopant profile 500 within the semiconductor layer 202 produced by the oxygen implantation process 402, depicting change in concentration of oxygen (vertical axis) as a function of distance (horizontal axis) away from an interface between the top region 204a' and the oxygen-doped region 202b, which is indicated by "0" at the intersection of the vertical and horizontal axes. The distance over which the concentration of oxygen remains above 0 atoms/cm$^3$ may be considered a thickness of the oxygen-doped region 202b. In some examples, the concentration of oxygen abruptly decreases at the interface and gradually depletes in a direction away from the interface, as indicated by profile 502. In some examples, after the abrupt decrease at the interface, the concentration of oxygen may first increase slightly (such increase may be negligible in comparison to the peak concentration) and then decrease, as indicated by dotted profile 504 in FIG. 4B.

Figures 5A, 5B:
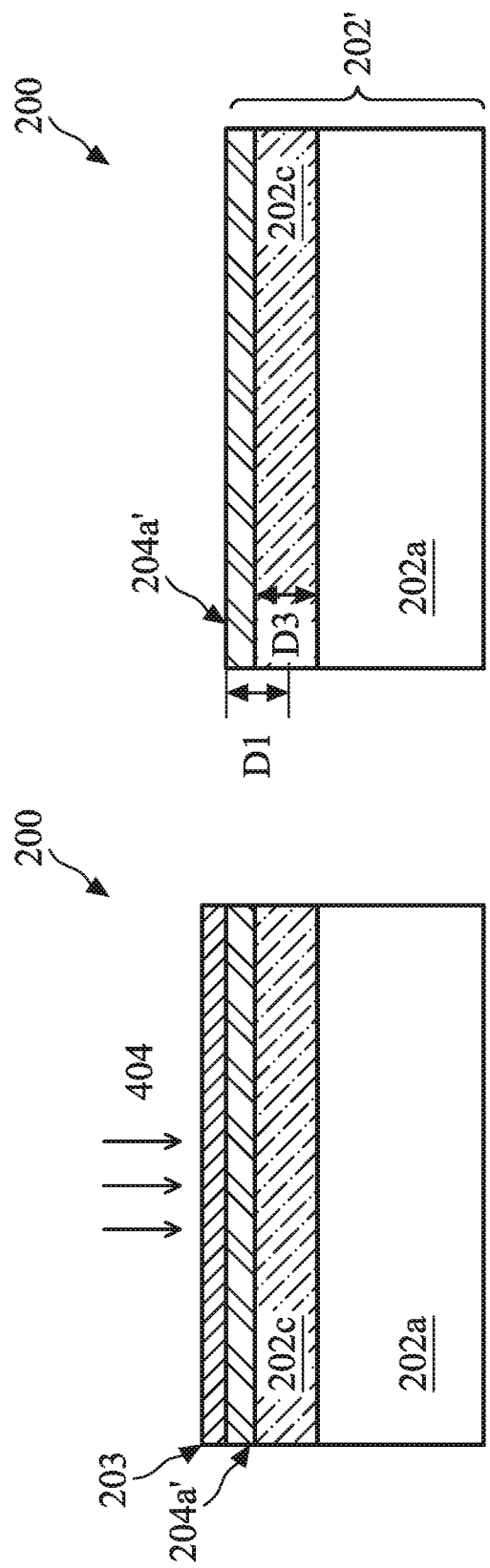

Subsequently, as depicted in FIG. 5A, method 300 proceeds from operation 310 to operation 340 and performs an annealing process 404 to allow oxygen atoms in the oxygen-doped region 202b to react with the composition of the semiconductor layer 202, thereby forming an oxide layer 202c. Accordingly, the resulting oxide layer 202c is buried in the semiconductor layer 202, which together constitute the substrate 202' as depicted in FIG. 5B. In the present embodiments, a thickness D3 of the oxide layer 202c ranges from about 2 nm to about 10 nm. In some embodiments, a ratio of the thickness D3 to the distance D1 (i.e., the thickness of the top region 204a' as defined in FIG. 4A) is about 0.3 to about 2.5. If the ratio is below about 0.3, i.e., if the oxide layer 202c is too thin, the ability to retard leakage from the bottommost transistor having the top region 204a' as its channel may be compromised. If the ratio is above about 2.5, i.e., if the oxide layer 202c is too thick, the crystal structure of a subsequently formed epitaxial S/D feature (e.g., epitaxial S/D feature 216) may be disrupted due to too much overlap with the oxide layer 202c (discussed in detail below), resulting in poor device performance.

The annealing process 404 may be implemented by any suitable annealing method, such as thermal annealing, laser annealing, spike annealing, other suitable annealing methods, or combinations thereof. Depending upon the specific annealing method(s) selected, the annealing process 404 may be implemented at any suitable time duration. In one example, if laser annealing method is selected, the annealing process 404 may be implemented in the range of nanoseconds to milliseconds. In another example, if spike annealing method is selected, the annealing process 404 may be implemented in the range of milliseconds to seconds. In yet another example, if thermal annealing method is selected, the annealing process 404 may be implemented in the range of minutes to hours. In some embodiments, increasing the annealing temperature lowers the duration of time needed to oxidize Si in the oxygen-doped region 202b.

In the present embodiments, the annealing process 404 is implemented at a temperature configured to allow the oxidation of Si in the oxygen-doped region 202b. In other words, the annealing process 404 is configured to provide sufficient energy to mobilize the oxygen atoms in the oxygen-doped region 202b from interstitial sites to crystalline sites, thereby forming the oxide layer 202c having at least partially crystallized silicon oxide in the form of SiO$_x$, where $1 \leq x \leq 2$. In the present embodiments, the oxide layer 202c is free, or substantially free, of Ge (e.g., elemental Ge and/or germanium oxide). In some embodiments, one or more gas, such as O$_2$ and/or H$_2$, may be provided during the implementation of the annealing process 404 to enhance the stabilization of the oxygen atoms in the crystalline sites. In some examples, the annealing process 404 may be implemented at a temperature of about 1000 degrees C. to about 1300 degrees C. After performing the annealing process 404, referring to FIG. 5B, the protective layer 203 is removed from the top surface of the semiconductor layer 202 by any suitable method, such as a wet etching process utilizing peroxide.

In the present embodiments, the oxide layer 202c is buried in the semiconductor layer 202 at the distance D1 from the top surface of the semiconductor layer 202. In some embodiments, the annealing process 404 causes the oxygen atoms in the oxygen-doped region 202b to diffuse vertically. It is noted, however, that such decrease does not significantly affect the thickness of the top region 204a', which becomes the bottommost channel layer of the ML in some embodiments. In the present embodiments, the oxide layer 202c is configured to retard any leakage current existing between heavily doped source/drain (S/D) features in the device 200, thereby alleviating the effects of drain-induced barrier lowering (DIBL). In some embodiments, the effect of retardation of the oxide layer 202c is determined by the concentration of oxygen (see FIG. 4B), such that a higher concentration of oxygen correlates to a greater extent of retardation. In the present embodiments, due to the oxide layer 202c being buried in the semiconductor layer 202, which includes elemental Si, the concentration of oxygen in the semiconductor layer 202 changes mostly abruptly across the interface between the oxide layer 202c and the top region 204a' as depicted in FIG. 4B.

In an alternative embodiment, referring to FIGS. 1B and 6A, method 300 proceeds from operation 302 to operation 320 along Pathway B and forms the oxygen-doped region 202b in the semiconductor layer 202 in a manner substantially similar to that of operation 310 implementing the oxygen implantation process 402. Accordingly, the oxygen dopant profile 400 discussed above with respect to FIG. 4B is also applicable at operation 320. Subsequently, still referring to FIG. 6A, method 300 proceeds to operation 322 and forms an epitaxial SiGe layer 204b' on the semiconductor layer 202 (i.e., on the substrate 202') after forming the oxygen-doped region 202b. If the protective layer 203 is included in the device 200, method 300 first removes the protective layer 203 by a suitable method as discussed above before forming the epitaxial SiGe layer 204b'. In the present embodiments, the epitaxial SiGe layer 204b' serves as one of the non-channel layers of the ML subsequently formed over the substrate 202'. In some embodiments, the epitaxial SiGe layer 204b' protects the underlying semiconductor layer 202 from potential thermal damage caused by the subsequently-applied annealing process 404. The epitaxial SiGe layer 204b' may be formed by any suitable epitaxy process including CVD techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing Ge, which interact with the composition of the underlying substrate, i.e., the semiconductor layer 202. Subsequently, referring to FIG. 6B, method 300 at operation 340 performs the annealing process 404 to the device 200 as discussed above with respect to FIG. 5B, thereby forming the oxide layer 202c. Details of the oxide layer 202c (e.g., the thickness D3 and its relation to the distance D1) have been discussed above with respect to FIG. 5B. In the present embodiments, performing the annealing process 404 has negligible effect on the composition and structure of the epitaxial SiGe layer 204b' as it is substantially free of oxygen.

In yet another alternative embodiment, referring to FIGS. 1B and 7A, method 300 proceeds from operation 302 to operation 330 along Pathway C and forms an epitaxial SiGe layer 206 over the semiconductor layer 202 before performing the oxygen implantation process 402 at operation 334. The epitaxial SiGe layer 206 may be similar to the epitaxial SiGe layer 204b' in composition and may be formed by any suitable epitaxy process as discussed above with respect to FIG. 6A. In the present embodiments, the epitaxial SiGe layer 206 is subsequently oxidized to form the oxide layer 206c.

Still referring to FIG. 7A, method 300 at operation 332 proceeds to forming an epitaxial Si layer 207 over the epitaxial SiGe layer 206 in any suitable epitaxy process discussed above with respect to FIG. 6A utilizing a Si-containing precursor. In the present embodiments, the epitaxial Si layer 207 is configured to be one of the channel layers of the ML subsequently formed over the substrate 202'. In the present embodiments, the epitaxial Si layer 207 and the top region 204a' have substantially the same composition, i.e., including elemental Si and free of O and Ge. However, as depicted in FIGS. 4-6B, the top region 204a' is a portion of the semiconductor layer 202, whereas the epitaxial Si layer 207 is subsequently grown over the semiconductor layer 202 and separated from the semiconductor layer 202 by the epitaxial SiGe layer 206. In the present embodiments, a thickness D4 of the epitaxial Si layer 207 is substantially similar to the distance D1 as defined above with respect to FIG. 4A. Optionally, as depicted in FIG. 7A, the protective layer 203 may be formed over or as a portion of the epitaxial Si layer 207 as discussed above with respect to FIG. 4A.

Referring to FIG. 7B, method 300 at operation 334 performs the oxygen implantation process 402 to dope the epitaxial SiGe layer 206, thereby forming an oxygen-doped SiGe layer 206b disposed between the semiconductor layer 202 and the epitaxial Si layer 207. In the present embodiments, the oxygen implantation process 402, which has been discussed in detail above with respect to operation 310 and FIG. 4A, is controlled such that the semiconductor layer 202 and the epitaxial Si layer 207 remain undoped or substantially undoped. As such, the energy of implantation for doping the epitaxial SiGe layer 206 is adjusted based on the thickness of the epitaxial Si layer 207, with a thicker epitaxial Si layer 207 corresponding to higher energy of implantation.

Now referring to FIG. 7C, method 300 proceeds to operation 340 and performs an annealing process 406 to the device 200, thereby transforming the oxygen-doped SiGe layer 206b into an oxide layer 206c. In some embodiments, a thickness D5 of the oxide layer 206c is substantially similar to the thickness D3 of the oxide layer 202c as discussed above with respect to FIG. 5B, and the comparison between the thickness D3 and the distance D1 discussed above also holds true for the thickness D5 and the thickness D4. As provided herein, the semiconductor layer 202, the oxide layer 206c, and the epitaxial Si layer 207 together constitute the substrate 202'. In the present embodiments, the annealing process 406 allows oxygen atoms introduced by the oxygen implantation process 402 to react with the composition of the epitaxial SiGe layer 206, producing one or more oxide materials containing Si and/or Ge. In the present embodiments, the oxide layer 206c includes germanium oxide ($GeO_y$, where $1 \leq y \leq 2$) and/or silicon oxide ($SiO_x$, where $1 \leq x \leq 2$). The annealing process 406 may be implemented by any suitable annealing method, such as thermal annealing, laser annealing, spike annealing, other suitable annealing methods, or combinations thereof. Depending upon the specific annealing method(s) selected, the annealing process 404 may be implemented at any suitable time duration. Because Ge generally has a lower melting point (about 940 degrees C.) than Si (about 1412 degrees C.), the annealing process 406 may be implemented at a lower temperature and for a shorter duration than the annealing process 404 configured to oxidize only elemental Si (i.e., free of Ge). In some embodiments, the annealing process 406 is implemented by melting-laser annealing at or above the melting point of germanium for a duration on the order of microseconds. In the present embodiments, the annealing process 406 is configured to have negligible effect, or no effect at all, on portions of the substrate 202' outside the oxygen-doped SiGe layer 206b, i.e., on the epitaxial Si layer 207 and the semiconductor layer 202.

Figures 2A, 2B:
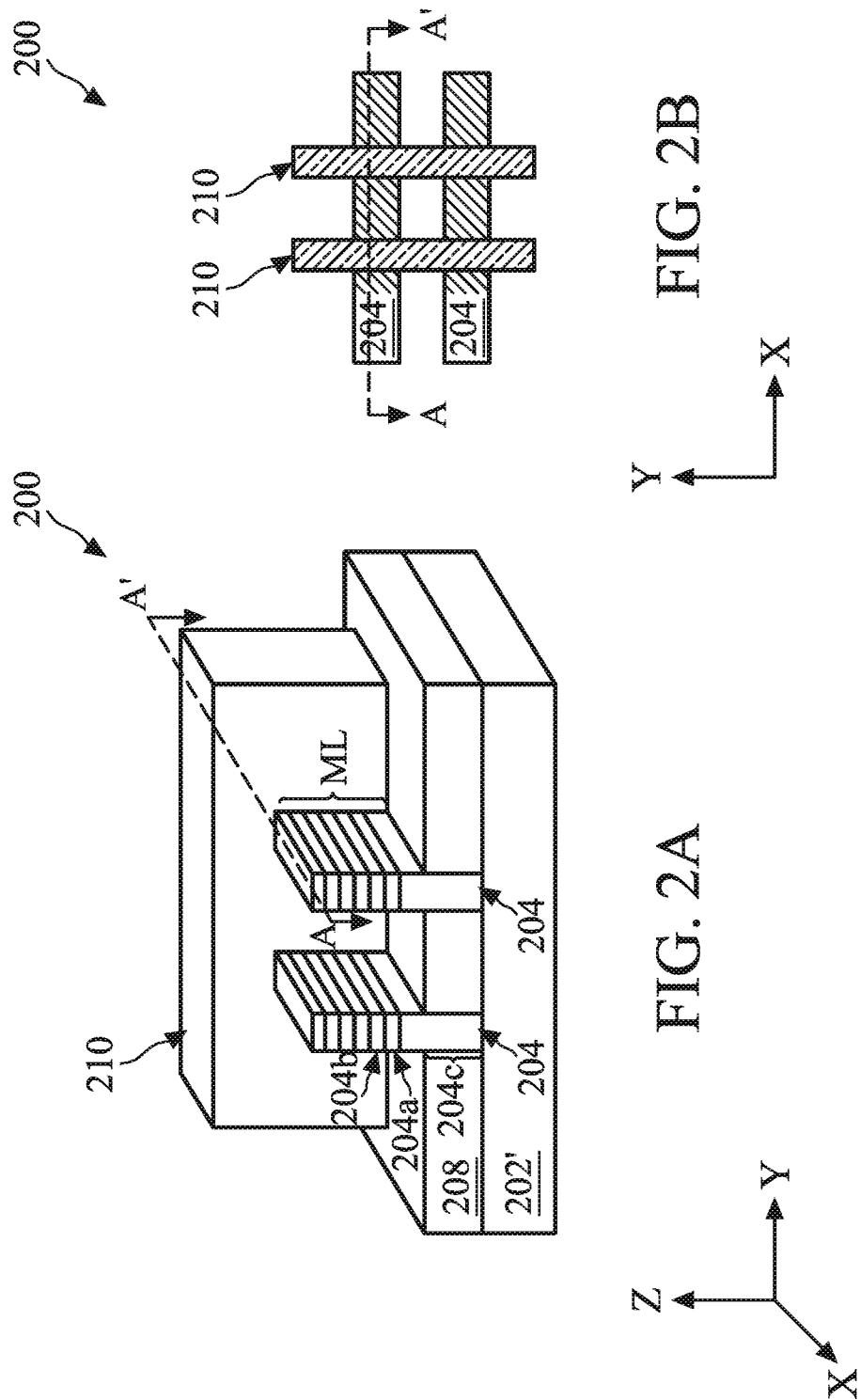
FIG. 2A is a three-dimensional perspective view of an example semiconductor device according to various embodiments of the present disclosure.
FIG. 2B is a planar top view of the semiconductor device shown in FIG. 2A according to various embodiments of the present disclosure.
Figure 8:
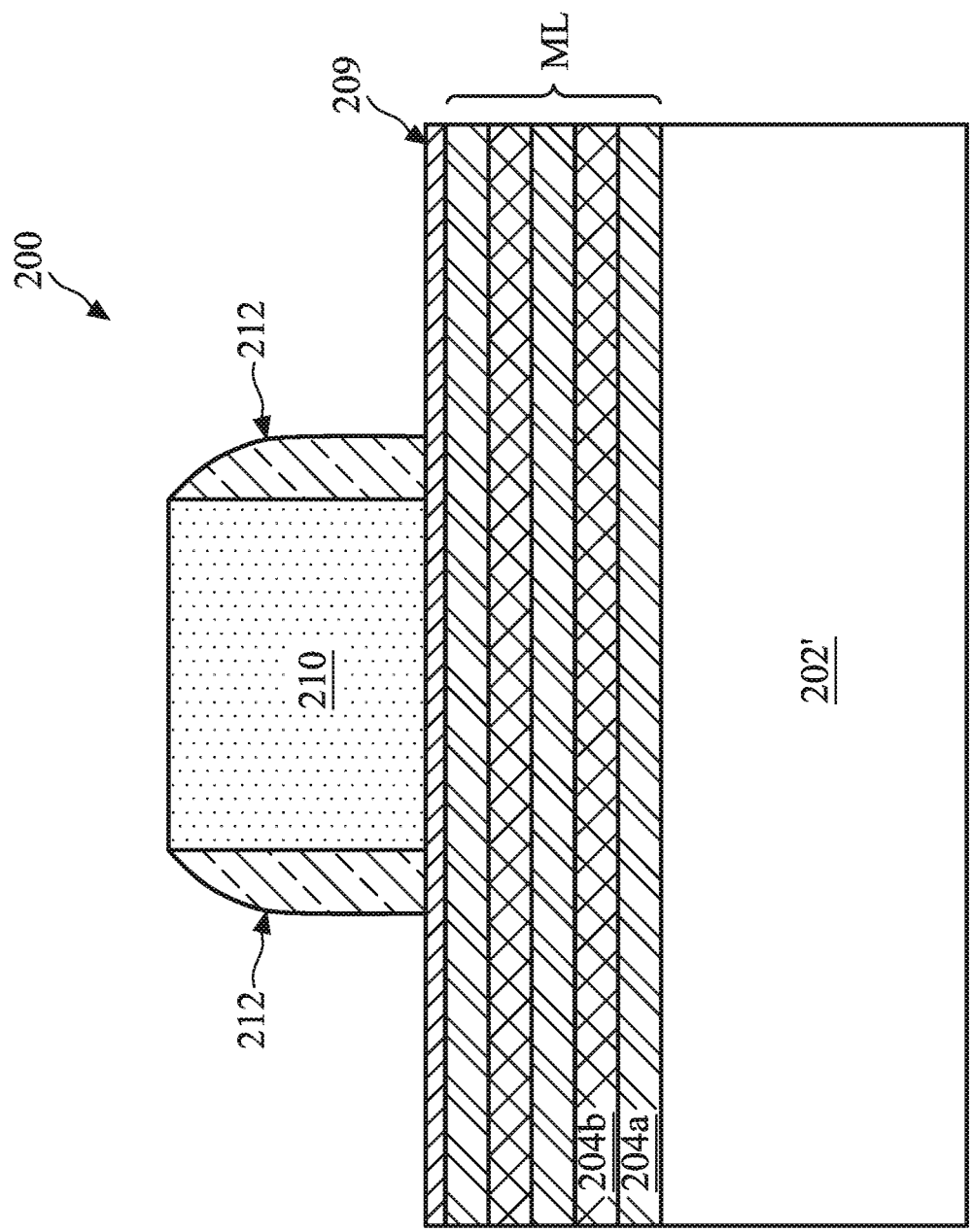

Now referring back to FIG. 1A and to FIGS. 2A, 2B, and 8, method 100 at operation 104 forms fin active regions 204 (hereafter referred to as the "fins 204") over the substrate 202', which may include the oxide layer 202c as depicted in FIGS. 5B and 6B or the oxide layer 206c as depicted in FIG. 7D. In the present embodiments, each fin 204 includes a base fin 204c protruding from the substrate 202' and a stack of alternating layers 204a and 204b (collectively referred to as the "multi-layer stack" or ML) disposed over the base fin 204c, which is a portion of the substrate 202'. In the present embodiments, referring to FIGS. 2A and 8, each layer 204a includes a semiconductor material such as, for example, Si, Ge, SiC, SiGe, GeSn, SiGeSn, SiGeCSn, other suitable semiconductor materials, or combinations thereof, while each layer 204b is a sacrificial layer having a different composition from that of the layer 204a. In one such example, the layer 204a may include elemental Si but is free, or substantially free, of Ge, and the layer 204b may include SiGe. In another example, the layer 204a may include elemental Si but is free, or substantially free, of Ge, while the layer 204b may include elemental Ge but is free, or substantially free, of Si. In some examples, the layer 204b may include a dielectric material such as, for example, silicon oxide, silicon nitride, silicon oxynitride, other suitable dielectric materials, or combinations thereof. In some examples, the fin 204 may include a total of three to ten pairs of alternating layers 204a and 204b; of course, other configurations may also be applicable depending upon specific design requirements. In the present embodiments, the top region 204a' (as depicted in FIGS. 5B and 6B), the epitaxial Si layer 207 as depicted in FIGS. 7A-7D, and the layer 204a of the ML are configured to have substantially the same composition (e.g., elemental Si and free, or substantially free, of Ge). Stated differently, in some embodiments, the top region 204a' and the epitaxial Si layer 207 may respectively serve as a portion of the ML. Furthermore, in some embodiments, the epitaxial SiGe layer 204b' as depicted in FIGS. 6A and 6B is configured to have substantially the same composition (e.g., SiGe) as the layer 204b and thus may also serve as a portion of the ML.

In the present embodiments, forming the ML includes alternatingly growing the layers 204a and 204b in a series of epitaxy processes, each of which is similar to the epitaxy process implemented to form the epitaxial SiGe layer 204b' as discussed above. In some examples, the layers 204a and 204b may be formed into nanosheets, nanowires, or nanorods. A sheet (or wire) formation process may then remove the SiGe-containing layers, including the layers 204b and the epitaxial SiGe layer 204b', if included, to form multiple openings between the Si-containing layers, including the layers 204a, and a metal gate structure is subsequently formed in the openings, thereby providing a GAA FET. For this reason, the layers 204a are hereafter referred to as channel layers 204a, and the layers 204b are hereafter referred to as non-channel layers 204b.

The fins 204 may be fabricated using suitable processes including photolithography and etch processes. The photolithography process may include forming a photoresist layer (resist) overlying the substrate 202', exposing the resist to a pattern, performing post-exposure bake processes, and developing the resist to form a masking element (not shown) including the resist. The masking element is then used for etching recesses into the substrate 202', leaving the fins 204 protruding from the substrate 202'. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

Still referring to FIG. 2A, the fins 204 protrude from the substrate 202' and separated by the isolation features 208. The isolation features 208 may include silicon oxide, silicon nitride, silicon oxynitride, fluoride-doped silicate glass (FSG), a low-k dielectric material, and/or other suitable materials. The isolation features 208 may include shallow trench isolation (STI) features. In one embodiment, the isolation features 208 are formed by etching trenches in the substrate 202' during the formation of the fins 204. The trenches may then be filled with an isolating material described above by a deposition process, followed by a chemical mechanical planarization (CMP) process. In another embodiment, the isolation features 208 are formed by depositing a dielectric layer as a spacer layer over the fins 204 and subsequently recessing the dielectric layer such that a top surface of the isolation features 208 is below a top surface of the fins 204. Other isolation structure such as field oxide, local oxidation of silicon (LOCOS), and/or other suitable structures may also be implemented as the isolation features 208. Alternatively, the isolation features 208 may include a multi-layer structure, for example, having one or more thermal oxide liner layers. The isolation features 208 may be deposited by any suitable method, such as CVD, flowable CVD (FCVD), spin-on-glass (SOG), other suitable methods, or combinations thereof.

Still referring to FIGS. 2A, 2B, and 8, method 100 at operation 106 forms a dummy gate stack (i.e., a placeholder gate) 210 that includes polysilicon over the ML. In the present embodiments, portions of the dummy gate stack 210 are replaced with a high-k (i.e., a dielectric material having a dielectric constant greater than that of silicon dioxide, which is about 3.9) metal gate structure (HKMG) after forming other components of the device 200. The dummy gate stack 210 may be formed by a series of deposition and patterning processes. For example, the dummy gate stack 210 may be formed by depositing a polysilicon layer over the fins 204 and performing an anisotropic etching process (e.g., a dry etching process) to remove portions of the polysilicon. In the present embodiments, the device 200 further includes an interfacial layer 209, which is formed on the fin 204 before depositing the polysilicon layer by a suitable method, such as thermal oxidation, chemical oxidation, other suitable methods, or combinations thereof. Though not depicted, one or more hard mask layers may be formed over the dummy gate stack 210 to protect the dummy gate stack 210 from being etched during subsequently operations. The one or more hard mask layers are later removed before removing the dummy gate stack 210 to form a metal gate structure.

Thereafter, still referring to FIG. 8, the top spacers 212 may be formed on the sidewalls of the dummy gate stack 210. The top spacers 212 may be a single-layer structure or a multi-layer structure and may include silicon oxide, silicon nitride, silicon carbide, silicon oxynitride, silicon oxycarbide, other suitable materials, or combinations thereof. Each spacer layer of the top spacers 212 may be formed by first depositing a dielectric layer over the dummy gate stack 210 and subsequently removing portions of the dielectric layer in an anisotropic etching process (e.g., a dry etching process), leaving portions of the dielectric layer on the sidewalls of the dummy gate stack 210 as the top spacers 212.

Figure 9A:
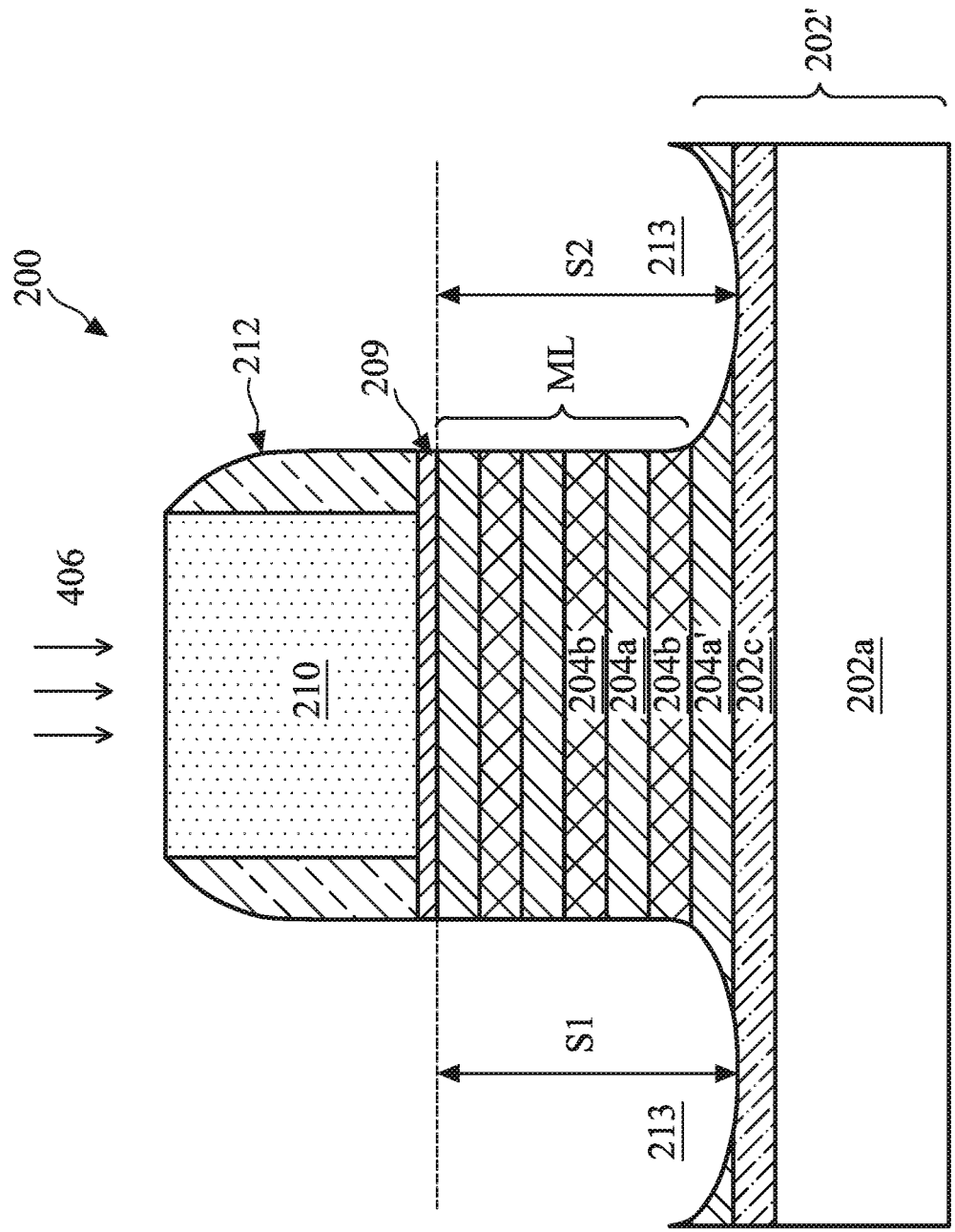
Figure 9B:
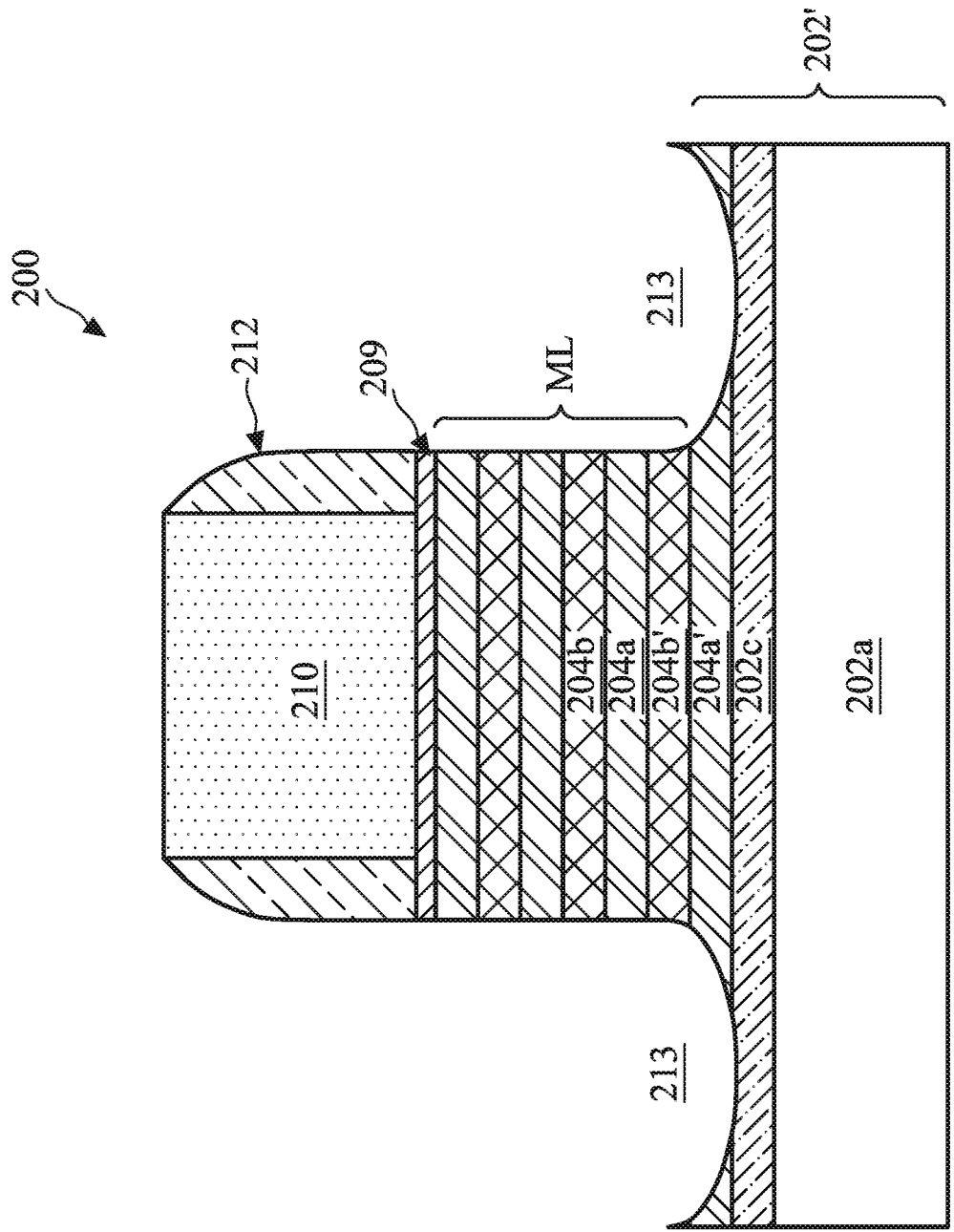
Figure 9C:
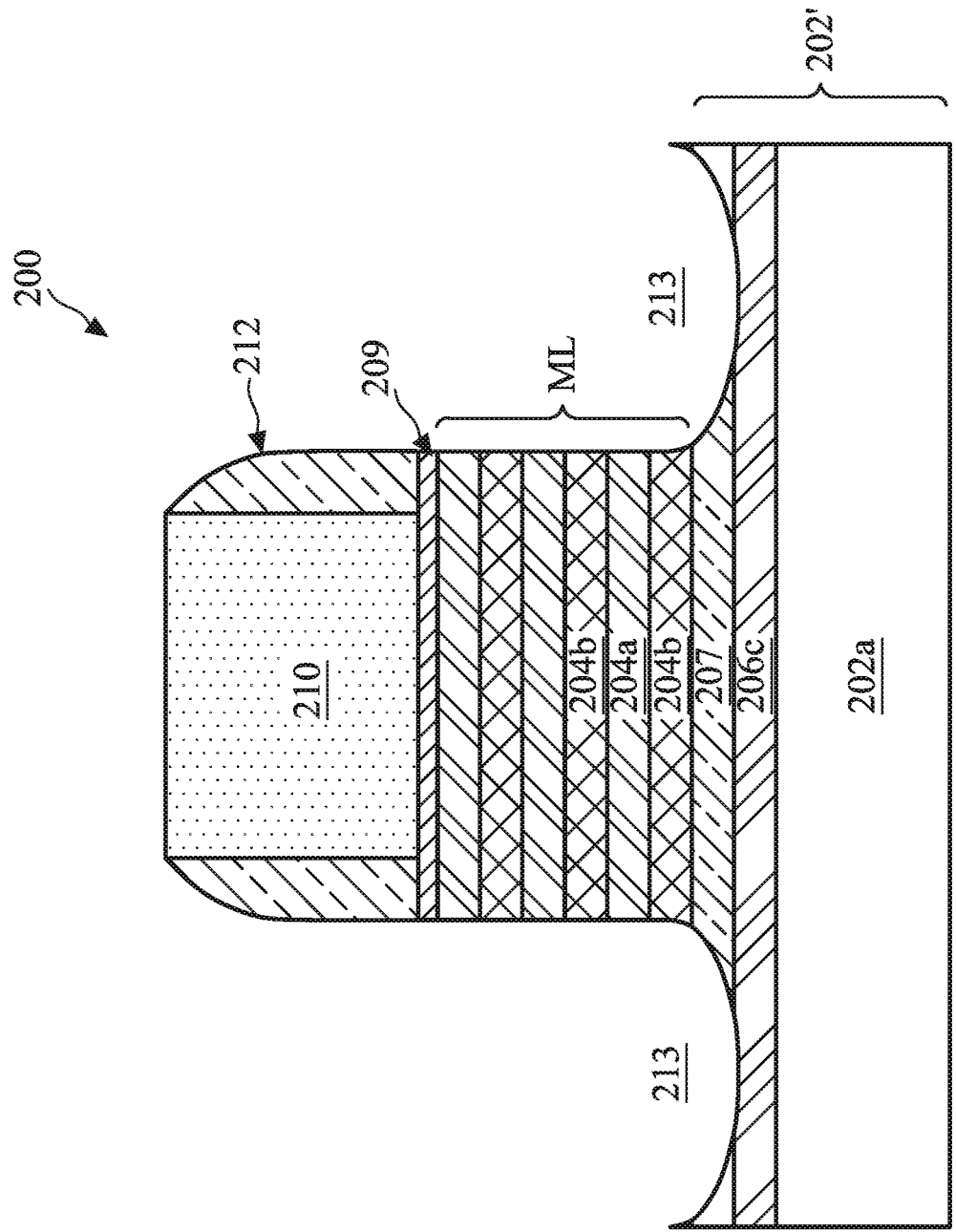

Referring to FIGS. 9A-9C, method 100 at operation 108 removes portions of the ML to form S/D recesses 213 in an etching process 408. Referring to FIGS. 9A and 9B, the S/D recesses 213 expose portions of the oxide layer 202c, i.e., a bottom surface of each S/D recess 213 is defined by the oxide layer 202c, which includes silicon oxide as discussed in detail with respect to FIGS. 5B and 6B. Similarly, referring to FIG. 9C, the S/D recesses 213 expose portions of the oxide layer 206c, i.e., a bottom surface of each S/D recess 213 is defined by the oxide layer 206c, which includes at least germanium oxide as discussed in detail above with respect to FIG. 7D. Accordingly, in the present embodiments, a subsequently formed epitaxial S/D feature in the S/D recess 213 overlaps with a portion of the oxide layer 202c or the oxide layer 206c.

In the present embodiments, the etching process 408 selectively removes the portions of the ML without removing, or substantially removing, the oxide layer 202c or 206c embedded in the substrate 202'. In other words, the etching process 408 is configured to self-stop on the oxide layer 202c or 206c by controlling etching selectivity of the ML with respect to the oxide layer 202c or 206c. In the present embodiments, the etching process 408 is a dry etching process employing a suitable etchant capable of selectively removing Si (i.e., the channel layers 204a) and SiGe (i.e., the non-channel layers 204b) of the ML with respect to silicon oxide ($SiO_x$, where $1 \leq x \leq 2$) and/or germanium oxide ($GeO_y$, where $1 \leq y \leq 2$) included in the oxide layer 202c or the oxide layer 206c. In some embodiments, the dry etchant is a chlorine-containing etchant including $Cl_2$, $SiCl_4$, $BCl_3$, other chlorine-containing gas, or combinations thereof. In some embodiments, the etching selectivity of the ML with respect to the oxide layer 202c or 206c is about 20:1 to about 30:1, i.e., the etching process 408 removes the ML at a rate of 20 to 30 times that of the oxide layer 202c or 206c. In some embodiments, the etching process 408 may be tuned by adjusting duration, temperature, pressure, source power, bias voltage, bias power, etchant flow rate, and/or other suitable parameters. A cleaning process may subsequently be performed to clean the S/D recesses 213 with a hydrofluoric acid (HF) solution or other suitable solution.

In some instances, differences in etchant loading during the etching process 408 may lead to uneven depths of the S/D recesses 213 and inadvertently cause variations in performance of the GAA FETs. The present embodiments remedy such issue by providing the oxide layer 202c or 206c to act as a stopping layer to the etching process 408, thereby equalizing the depths of the S/D recesses 213 and eliminating variations in device performance. For example, as depicted in FIG. 9A, depths S1 and S2 of the S/D recesses 213 may be substantially the same owing to the oxide layer 202c that terminates the etching process 408. Similar effects are achieved with the oxide layer 202c and the oxide layer 206c in the embodiments depicted in FIGS. 9B and 9C, respectively.

Figure 10:
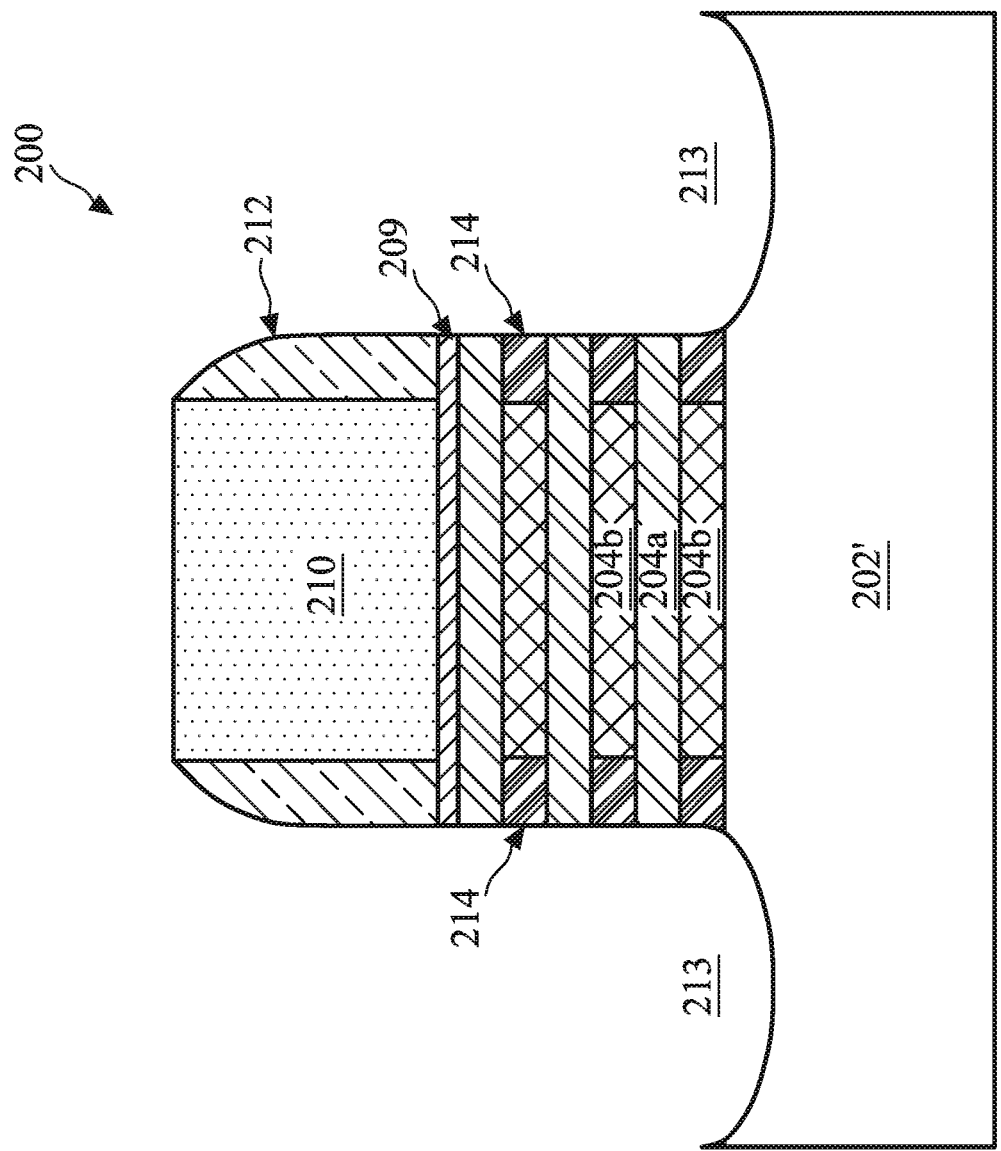

Referring to FIG. 10, method 100 at operation 110 forms inner spacers 214 on portions of the non-channel layers 204b (and the epitaxial SiGe layer 204b', if present) exposed in the S/D recesses 213. The inner spacers 214 may include any suitable dielectric material comprising silicon, carbon, oxygen, nitrogen, other elements, or combinations thereof. For example, the inner spacers 214 may include silicon nitride (SiN), silicon oxide (SiO and/or $SiO_2$), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), air, other suitable dielectric material, or combination thereof. The inner spacers 214 may each be configured as a single-layer structure or a multi-layer structure including a combination of the dielectric materials provided herein. In some embodiments, the inner spacers 214 have a different composition from that of the top spacers 212.

Method 100 may form the inner spacers 214 in a series of etching and deposition processes. For example, forming the inner spacers 214 may begin with selectively removing portions of the non-channel layers 204b and/or the epitaxial SiGe layer 204b' (without removing or substantially removing portions of the channel layers 204a, the top region 204a', and/or the epitaxial Si layer 207) to form trenches (not depicted). The non-channel layers 204b may be removed by any suitable process, such as a dry etching process. Subsequently, one or more dielectric layers are formed in the trenches, followed by one or more etching processes to remove (i.e., etch back) excess dielectric layer(s) deposited on exposed surfaces of the channel layers 204a, the top region 204a', and/or the epitaxial Si layer 207, thereby forming the inner spacers 214 as depicted in FIG. 10. The one or more dielectric layers may be deposited by any suitable method, such as ALD, CVD, physical vapor deposition (PVD), other suitable methods, or combinations thereof.

Figure 11:
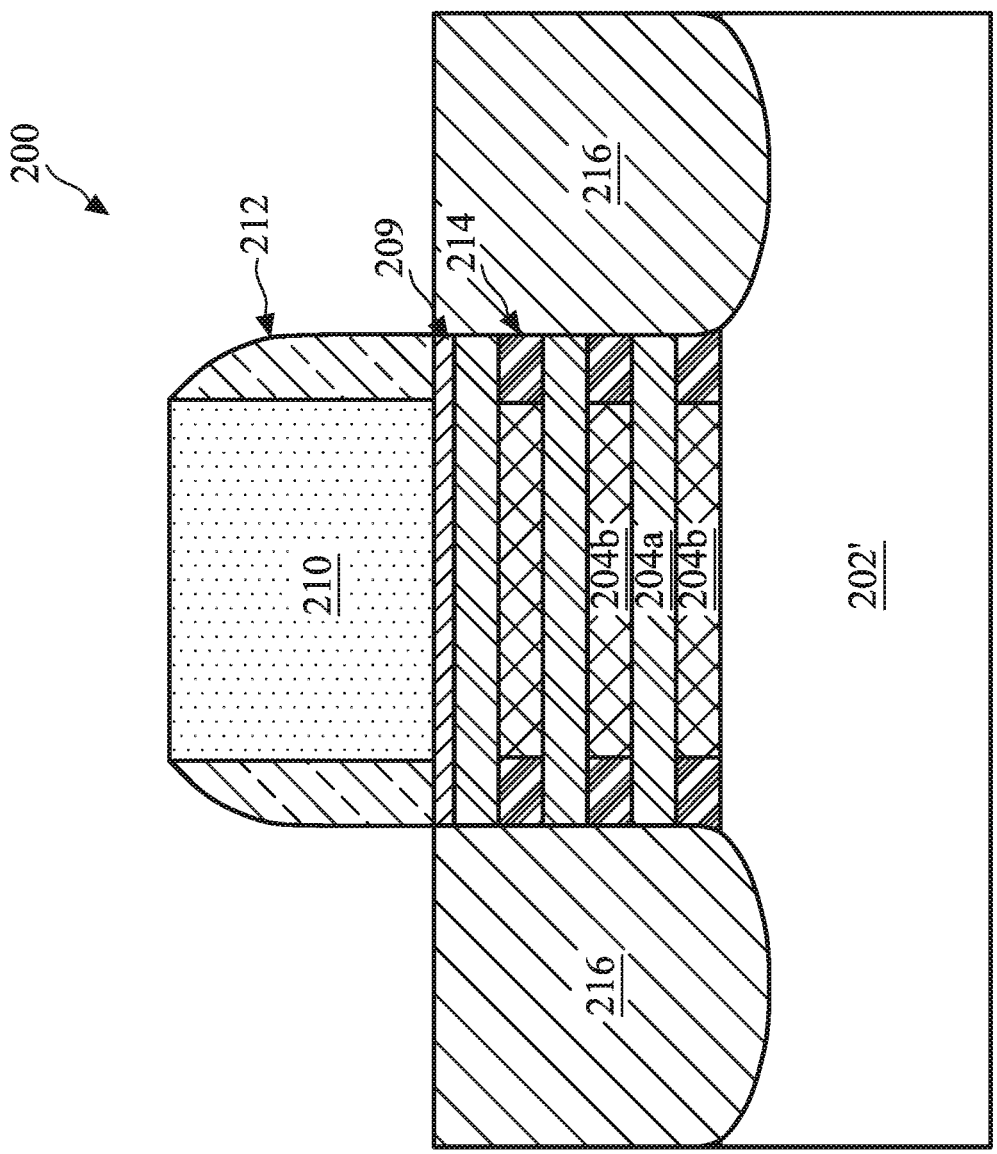
Figure 14A:
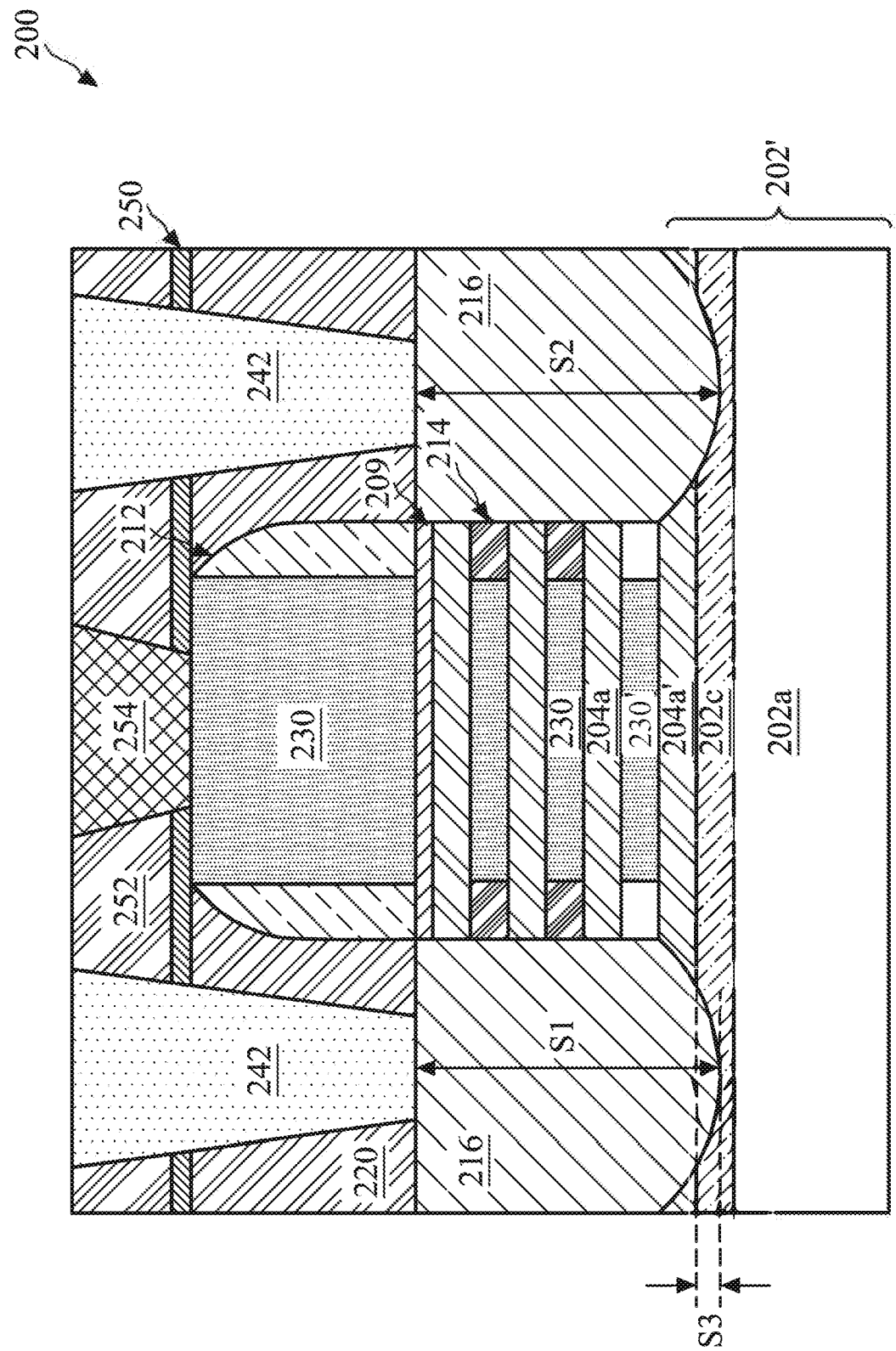
Figure 14B:
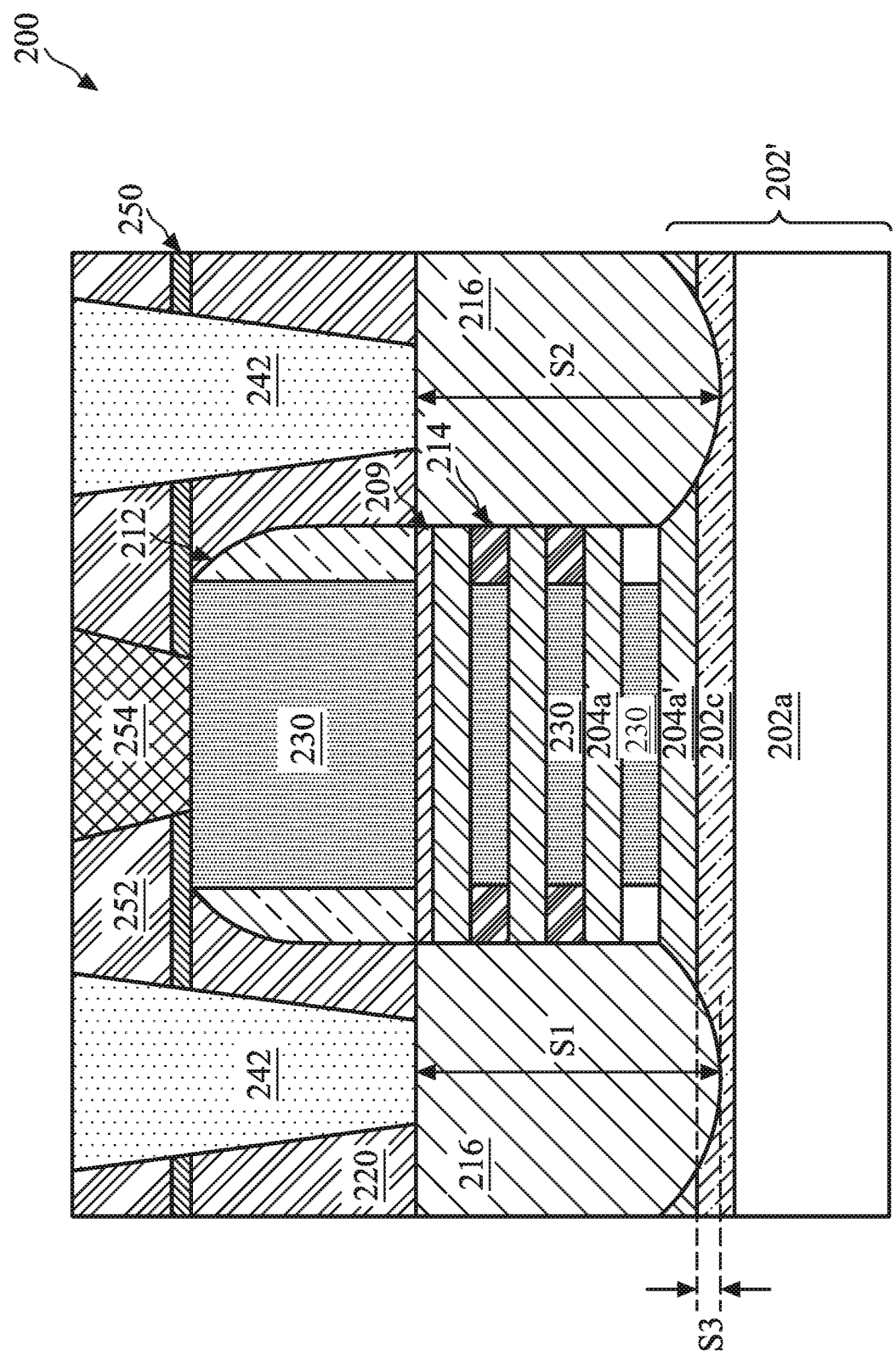
Figure 14C:
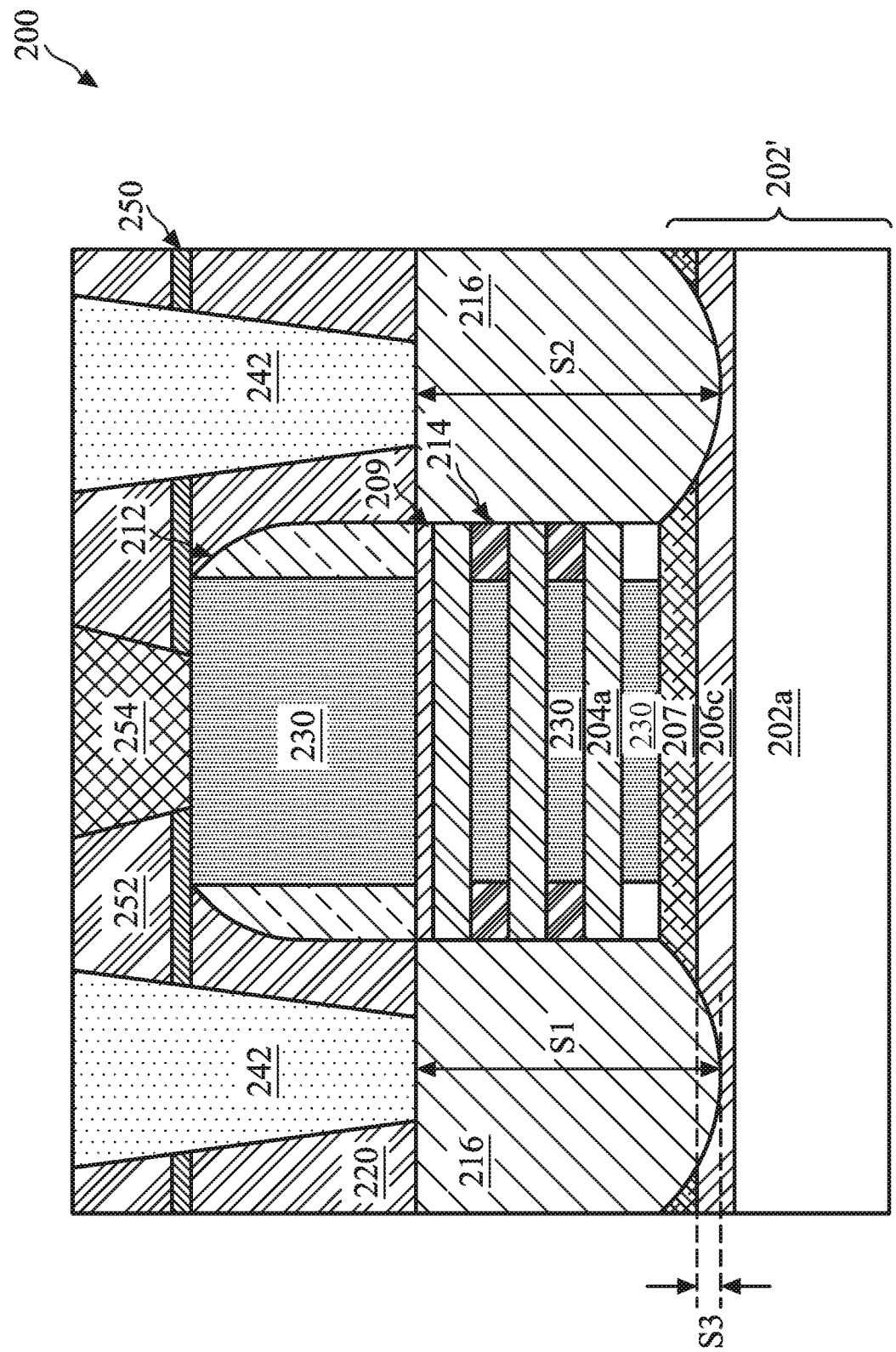

Referring to FIG. 11, method 100 at operation 112 forms an epitaxial S/D feature 216 in each S/D recess 213, such that the epitaxial S/D feature 216 overlaps with a portion of the oxide layer 202c (FIGS. 14A and 14B) or with a portion of the oxide layer 206c (FIG. 14C). Each of the epitaxial S/D features 216 may be suitable for forming a p-type FET device (e.g., including a p-type epitaxial material) or alternatively, an n-type FET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, one or more epitaxy growth processes are performed to grow an epitaxial material in each S/D recess 213. For example, method 100 may implement an epitaxy growth process as discussed above with respect to forming the epitaxial SiGe layer 204b'. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 216.

Figure 12:
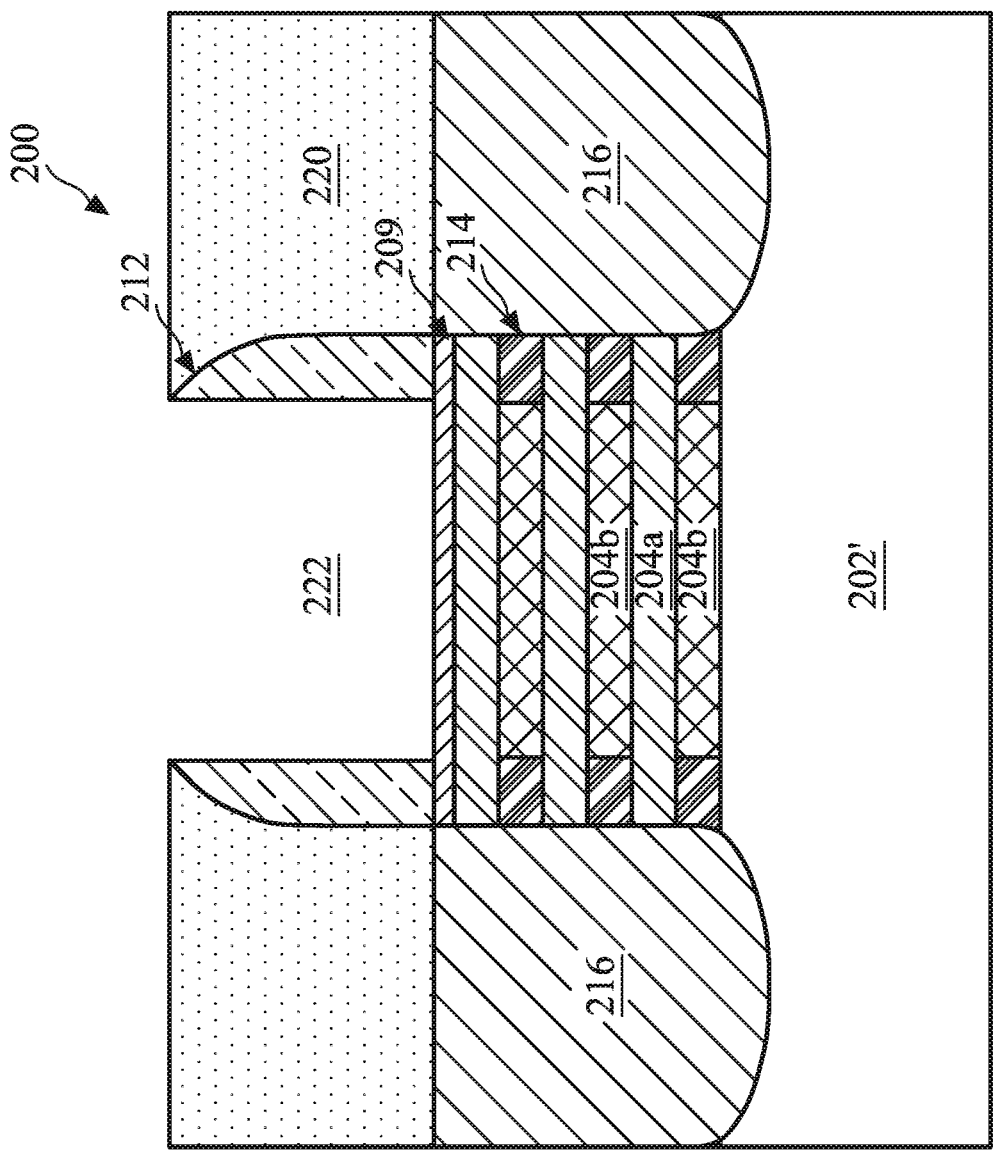

Referring to FIG. 12, method 100 at operation 114 subsequently removes the dummy gate stack 210 to form a gate trench 222 between the top spacers 212. Before removing the dummy gate stack 210, method 100 forms an interlayer dielectric (ILD) layer 220 over the epitaxial S/D features 216 by CVD, FCVD, SOG, other suitable methods, or combinations thereof. The ILD layer 220 may include silicon oxide, a low-k dielectric material, TEOS, doped silicon oxide (e.g., BPSG, FSG, PSG, BSG, etc.), other suitable dielectric materials, or combinations thereof. In the depicted embodiments, method 100 first forms an etch-stop layer (ESL; not depicted) over the epitaxial S/D features 216 before forming the ILD layer 220. The ESL may include silicon nitride, silicon oxynitride, oxygen- or carbon-doped silicon nitride, other suitable materials, or combinations thereof, and may be formed by CVD, PVD, ALD, other suitable methods, or combinations thereof. Thereafter, method 100 may planarize the ILD layer 220 in one or more CMP processes to expose a top surface of the dummy gate stack 210. Thereafter, at least portions of the dummy gate stack 210 are removed from the device 200 to form the gate trench 222 by any suitable etching process, such as a dry etching process. In the present embodiments, the interfacial layer 209 remains over the ML after removing the dummy gate stack 210.

Figure 13:
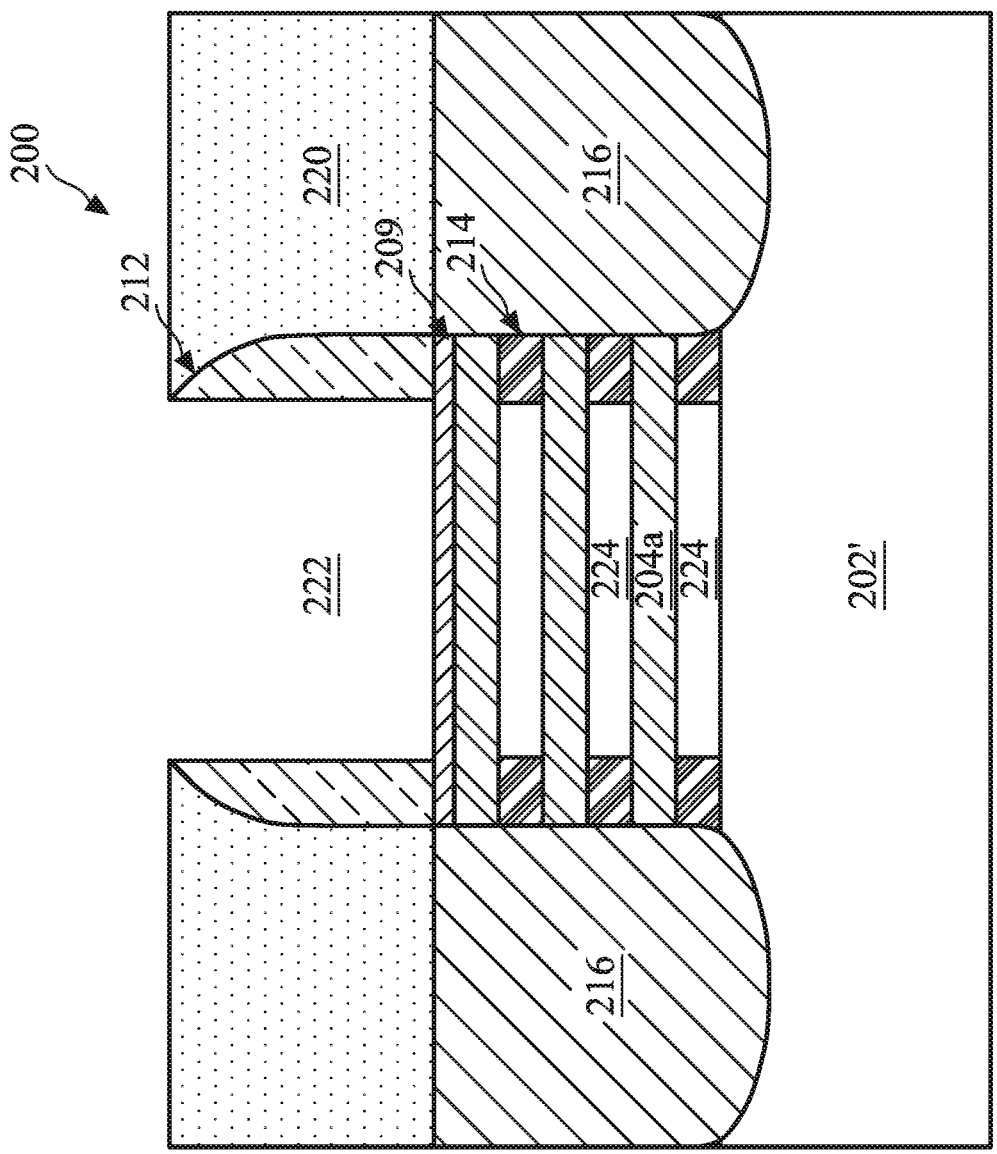

Referring to FIGS. 13, method 100 at operation 116 then removes the non-channel layers 204b and/or the epitaxial SiGe layer 204b' from the ML in the sheet (or wire) formation process, thereby forming opening 224 between the channel layers 204a, the top region 204a', and/or the epitaxial Si layer 207. The non-channel layers 204b and/or the epitaxial SiGe layer 204b' may be selectively removed by any suitable etching process, such as dry etching, wet etching, RIE, or combinations thereof. In one example, a wet etching process employing ammonia ($NH_3$) and/or hydrogen peroxide ($H_2O_2$) may be performed to selectively remove the non-channel layers 204b and/or the epitaxial SiGe layer 204b'. In another example, a dry etching process employing HF and/or other fluorine-based etchant(s), such as $CF_4$, $SF_6$, $CH_2F_2$, $CHF_3$, $C_2F_6$, other fluorine-containing etchants, or combinations thereof, may be implemented to remove the non-channel layers 204b and/or the epitaxial SiGe layer 204b'.

Now referring to FIGS. 14A-14C, which are consistent with embodiments of the device 200 depicted in FIGS. 9A-9C, respectively, method 100 at operation 118 forms the HKMG 230 in the gate trench 222 and in the openings 224, such that the HKMG 230 is interposed between the epitaxial S/D features 216. In the present embodiments, after replacing the dummy gate stack 210 and the non-channel layers 204b (and/or the epitaxial SiGe layer 204b') with the HKMG 230, the embodiment depicted in FIG. 14B is the same, or substantially the same, as that depicted in FIG. 14A, both of which include the top region 204a' and the oxide layer 202c as portions of the substrate 202'. In contrast, the embodiment depicted in FIG. 14C includes the epitaxial Si layer 207 and the oxide layer 206c as portions of the substrate 202'.

Notably, in the present embodiments, the oxide layer 202c is free, or substantially free, of Ge, and the oxide layer 206c includes at least germanium oxide as discussed above. Furthermore, in the present embodiments, each epitaxial S/D feature 216 overlaps with the oxide layer 202c (FIGS. 14A and 14B) or the oxide layer 206c (FIG. 14C) by a vertical distance S3. In some embodiments, a ratio of S3 to the depth S1 or S2 of the epitaxial S/D feature 216 as defined above with respect to FIG. 9A is about 0.04 to about 0.2. If the ratio is less than about 0.04, i.e., if the overlap is too shallow, then the retardation of the bottom leakage current by the oxide layer 202c or 206c may become less effective. If the ratio is greater than about 0.2, then the crystal structure and the resulting electrical property of the bottom portions of the epitaxial S/D features 216 may be compromised due to poor epitaxial growth in the oxide layer 202c or 206c.

As provided herein, HKMG 230' depicted in FIGS. 14A-14C is a bottom portion of the HKMG 230 configured to form the bottommost GAA FET. To eliminate the possibility of shorting such GAA FET in the event that the sheet formation process fails to completely remove the bottommost non-channel layer 204b (or the epitaxial SiGe layer 204b'), the epitaxial S/D features 216 are configured to extend below the HKMG 230'. While such practice has generally been adequate, it may occasionally produce undesirable leakage current between the epitaxial S/D features 216 due to poor gate control. To remedy this and other shortcomings, the present disclosure provides embodiments of GAA FETs having the epitaxial S/D features 216 contacting a dielectric layer (e.g., the oxide layer 202c or the oxide layer 206c) buried in the substrate 202', thereby reducing or eliminating the leakage current between the epitaxial S/D features 216.

The HKMG 230 (including the HKMG 230') includes at least a high-k dielectric layer (not depicted) disposed in the gate trenches 222 and in the opening 224 and a metal gate electrode (not depicted) disposed over the high-k dielectric layer. The high-k dielectric layer may include any suitable high-k dielectric material, such as hafnium oxide, lanthanum oxide, other suitable materials, or combinations thereof. The metal gate electrode may further include at least one work function metal layer and a bulk conductive layer disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The HKMG 230 may further include numerous other layers (not depicted), such as an interfacial layer, a capping layer, a barrier layer, other suitable layers, or combinations thereof. In some embodiments, the number of material layers included in the HKMG 230 is determined by the size of the opening 224. Various layers of the HKMG 230 may be deposited by any suitable method, such as chemical oxidation, thermal oxidation, ALD, CVD, PVD, plating, other suitable methods, or combinations thereof.

Thereafter, method 100 at operation 120 may perform additional processing steps to the device 200. For example, method 100 may form S/D contacts 242 over the S/D features 216. Each S/D contact 242 may include any suitable conductive material, such as Co, W, Ru, Cu, Al, Ti, Ni, Au, Pt, Pd, other suitable conductive materials, or combinations thereof. Method 100 may form an S/D contact hole (or trench) in the ILD layer 220 via a series of patterning and etching processes and subsequently deposit a conductive material in the S/D contact hole using any suitable method, such as CVD, ALD, PVD, plating, other suitable processes, or combinations thereof. In some embodiments, a silicide layer (not depicted) is formed between the S/D features 216 and the S/D contact 242. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. Subsequently, method 100 may form additional features over the device 200 such as, for example, an ESL 250 disposed over the ILD layer 220, an ILD layer disposed over the ESL 250, a gate contact 254 in the ILD layer 252 to contact the HKMG 230, vertical interconnect features (e.g., vias; not depicted), horizontal interconnect features (e.g., conductive lines; not depicted), additional intermetal dielectric layers (e.g., ESLs and ILD layers; not depicted), other suitable features, or combinations thereof.

Although not intended to be limiting, one or more embodiments of the present disclosure provide many benefits to a semiconductor device and the formation thereof. For example, the present disclosure provides an isolation structure, and methods of forming the same, configured to retard or eliminate leakage current produced by epitaxial S/D features in a GAA FET, which includes a multi-layered structure of semiconductor (channel) layers interleaved with a metal gate structure. In the present embodiments, the isolation structure includes an oxide layer buried in a semiconductor substrate. The oxide layer may include silicon oxide and/or germanium oxide. In some embodiments, the oxide layer is free of Ge. In the present embodiments, bottom portions of the epitaxial S/D features are defined by and overlaps with the oxide layer, which exhibits etching selectivity with respect to the composition of the multi-layered structure. Embodiments of the disclosed methods can be readily integrated into existing processes and technologies for manufacturing GAA FETs.

In one aspect, the present disclosure provides a method that includes forming a semiconductor substrate having an oxide layer embedded therein, forming a multi-layer (ML) stack including alternating channel layers and non-channel layers over the semiconductor substrate, forming a dummy gate stack over the ML, forming an S/D recess in the ML to expose the oxide layer, forming an epitaxial S/D feature in the S/D recess, removing the non-channel layers from the ML to form openings between the channel layers, where the openings are formed adjacent to the epitaxial S/D feature, and forming a high-k metal gate stack (HKMG) in the openings between the channel layers and in place of the dummy gate stack.

In another aspect, the present disclosure provides a method that includes forming a semiconductor substrate having an oxide layer embedded therein, forming a ML structure including alternating Si layers and SiGe layers over the semiconductor substrate, forming a placeholder gate stack over the ML, forming an S/D recess in the ML to expose the oxide layer, forming an S/D feature in the S/D recess, and forming a metal gate stack in place of the placeholder gate stack and in place of the SiGe layers of the ML. In the present embodiments, forming the semiconductor substrate includes providing a first semiconductor layer comprising elemental Si, forming a second semiconductor layer on the first semiconductor layer, where the second semiconductor layer comprises SiGe, forming a third semiconductor layer on the second semiconductor layer, wherein the third semiconductor layer comprises elemental Si, performing an implantation process to dope the second semiconductor layer with oxygen, and performing an annealing process to the doped second semiconductor layer to form the oxide layer.

In yet another aspect, the present disclosure provides a semiconductor structure that includes a semiconductor substrate, an oxide layer disposed over the semiconductor substrate, a high-k metal gate structure (HKMG) interleaved with the stack of semiconductor layers, and an epitaxial S/D feature disposed adjacent to the HKMG, wherein a bottom portion of the epitaxial S/D feature is defined by the oxide layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an oxide layer disposed over the substrate;
a stack of semiconductor layers disposed over the oxide layer; and
an epitaxial source/drain (S/D) feature disposed adjacent to the stack of semiconductor layers, wherein a portion of the epitaxial S/D feature is horizontally surrounded by the oxide layer,
wherein the oxide layer has a concave top surface interfacing with the epitaxial S/D feature.

2. The semiconductor structure of claim 1, wherein the oxide layer includes silicon, germanium, or a combination thereof.

3. The semiconductor structure of claim 1, wherein a bottom surface of the portion of the epitaxial S/D feature is defined by the oxide layer.

4. The semiconductor structure of claim 1, wherein the epitaxial S/D feature is a first epitaxial S/D feature, the semiconductor structure further comprising a second epitaxial S/D feature disposed adjacent to the stack of semiconductor layers and over the oxide layer, wherein the oxide layer extends between the first epitaxial S/D feature and the second epitaxial S/D feature.

5. The semiconductor structure of claim 1, wherein the epitaxial S/D feature is disposed over a portion of a bottommost semiconductor layer of the stack of semiconductor layers,
wherein the portion of the bottommost semiconductor layer of the stack of semiconductor layers is in direct contact with the oxide layer.

6. The semiconductor structure of claim 1, wherein the substrate includes elemental silicon and the oxide layer includes silicon oxide.

7. A semiconductor structure, comprising:
a first semiconductor layer;
an oxide layer disposed over the first semiconductor layer;
a second semiconductor layer disposed over the oxide layer; and
an epitaxial source/drain (S/D) feature disposed over and in contact with a portion of the oxide layer and an inclined surface of the second semiconductor layer.

8. The semiconductor structure of claim 7, wherein the first semiconductor layer and the second semiconductor layer include elemental silicon, and
wherein the oxide layer includes germanium.

9. The semiconductor structure of claim 7, wherein a portion of the epitaxial S/D feature extends into the oxide layer.

10. The semiconductor structure of claim 7, wherein a first concentration of oxygen at an interface of the oxide layer and the second semiconductor layer is greater than a second concentration of oxygen at a position in the oxide layer and apart from the interface.

11. The semiconductor structure of claim 7, further comprising a metal gate structure disposed over the second semiconductor layer,
wherein the portion of the oxide layer has a concave surface.

12. The semiconductor structure of claim 7, further comprising a stack of semiconductor layers over the second semiconductor layer,
wherein a thickness of the second semiconductor layer directly below the stack of semiconductor layers is greater than a thickness of the second semiconductor layer directly below the epitaxial S/D feature.

13. A method, comprising:
providing a semiconductor substrate;
performing an implantation process to form an oxygen-rich region in the semiconductor substrate;
performing an annealing process to the oxygen-rich region, thereby converting the oxygen-rich region to an oxide layer in the semiconductor substrate;
forming a stack of semiconductor layers over the semiconductor substrate;
forming a dummy gate stack over the stack of semiconductor layers;
forming a source/drain recess in the stack of semiconductor layers and the oxide layer; and
forming a source/drain (S/D) feature in the source/drain recess.

14. The method of claim 13, further comprising forming a protective layer over the semiconductor substrate before performing the implantation process and removing the protective layer after performing the annealing process.

15. The method of claim 14, wherein forming the protective layer includes oxidizing a top portion of the semiconductor substrate.

16. The method of claim 13, wherein the oxygen-rich region includes silicon, germanium, or a combination thereof.

17. The method of claim 13, wherein the semiconductor substrate includes a first semiconductor layer, a germanium-containing layer over the first semiconductor layer, and a second semiconductor layer over the germanium-containing layer.

18. The method of claim 13, before performing the annealing process, further comprising forming a silicon germanium layer over the semiconductor substrate.

19. The method of claim 18, wherein the stack of semiconductor layers is formed over the silicon germanium layer, and
wherein the method further comprises replacing the dummy gate stack and the silicon germanium layer with a metal gate stack.

20. The method of claim 13, wherein the oxygen-rich region is buried in the semiconductor substrate.

* * * * *